(12) United States Patent
Nishimura et al.

(10) Patent No.: US 6,313,709 B1
(45) Date of Patent: Nov. 6, 2001

(54) PHASE-LOCKED LOOP

(75) Inventors: Eizo Nishimura; Masamichi Nakajima, both of Kanagawa-ken (JP)

(73) Assignee: Fujitsu General Limited, Kawasaki (JP)

( * ) Notice: Subject to any disclaimer, the term of this patent is extended or adjusted under 35 U.S.C. 154(b) by 0 days.

(21) Appl. No.: 09/647,235
(22) PCT Filed: Mar. 31, 1999
(86) PCT No.: PCT/JP99/01653
  § 371 Date: Sep. 25, 2000
  § 102(e) Date: Sep. 25, 2000
(87) PCT Pub. No.: WO99/52215
  PCT Pub. Date: Oct. 14, 1999

(30) Foreign Application Priority Data

Mar. 31, 1998 (JP) .................................................. 10-105396
Nov. 10, 1999 (JP) .................................................. 11-319638

(51) Int. Cl.$^7$ .............................. H03L 7/08; H03L 7/085; H03L 7/089
(52) U.S. Cl. .............................. 331/25; 331/1 A; 331/14; 331/17; 345/99; 345/213
(58) Field of Search ................................. 331/1 A, 14, 17, 331/25; 360/51; 375/376; 345/99, 213; 455/260

(56) References Cited

U.S. PATENT DOCUMENTS 5,361,277 * 11/1994 Grover ................................... 375/107
5,592,112 * 1/1997 Quiet et al. ........................... 327/158
5,847,614 * 12/1998 Gilbert et al. ........................... 331/14

FOREIGN PATENT DOCUMENTS 5-175949 * 7/1993 (JP) .

* cited by examiner

Primary Examiner—David Mis
(74) Attorney, Agent, or Firm—Flynn, Thiel, Boutell & Tanis, P.C.

(57) ABSTRACT

The present invention is concerned with a PLL comprising the phase comparator 20, loop filter 21, VCO 14 and loop counter 22, wherein there are further provided a prediction window circuit 23 for outputting HWIN (prediction window signal) for predicting the point at which the REF (reference signal) is generated, an omission compensation circuit 24 for detecting the omission of the REF at the time when HWIN is outputted and outputting d.VARX (the second correction signal) to offset the phase difference between d.REFX (the first correction signal) and the VAR (comparison signal) so that the phase comparator 20 outputs the signals Ph1 and Ph2 corresponding to the phase difference between the VAR and the d.REFX and the signals Ph1 and Ph2 corresponding to the phase difference between d.REFC and d.VARX when the omission of the REF has occurred, thereby enabling proper compensation for omission to be made and stable CLK (clock) to be generated even when VCO 14 having a very wide frequency variation range is used. Further, a circuit for generating the gate control signal Gc by advancing the phase of the VAR by 1 clock so that not only the 3-state signal corresponding to the phase difference between the REF and VAR can be outputted but also the 3-state buffers, which can be controlled in active state according to the signal Gc can be made available, whereby accurate control voltage corresponding to the phase difference can be outputted to the VCO to generate stable CLK even when the phase difference between the REF and VAR is close to 0.

19 Claims, 15 Drawing Sheets

Fig. 6
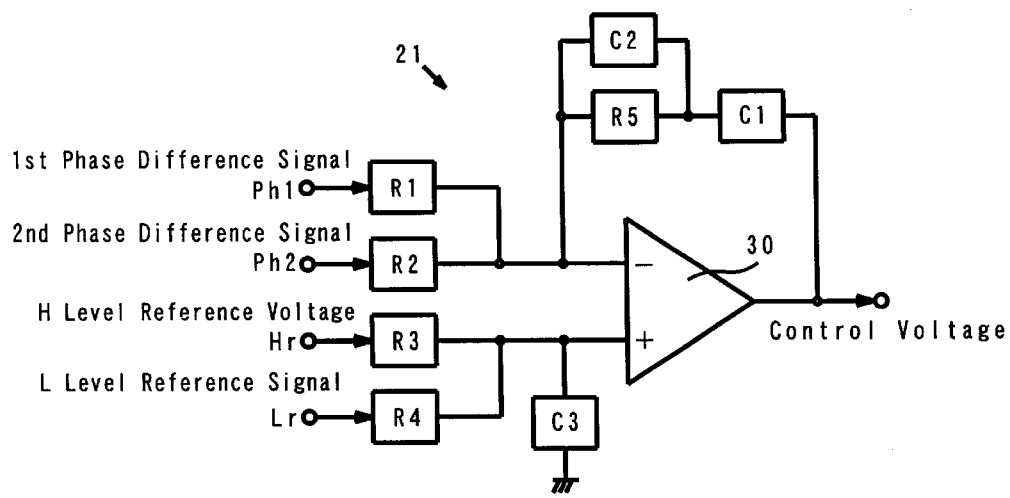
Fig. 7
(A)
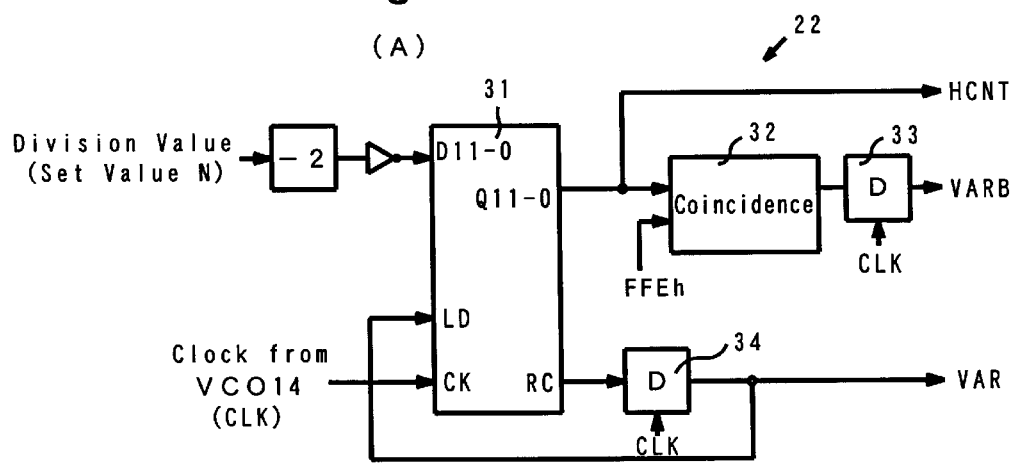
(B)
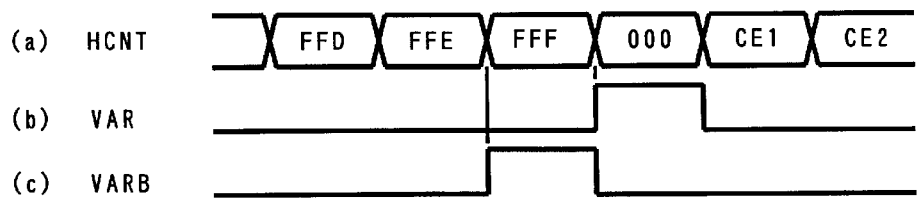

Fig. 17
(A)
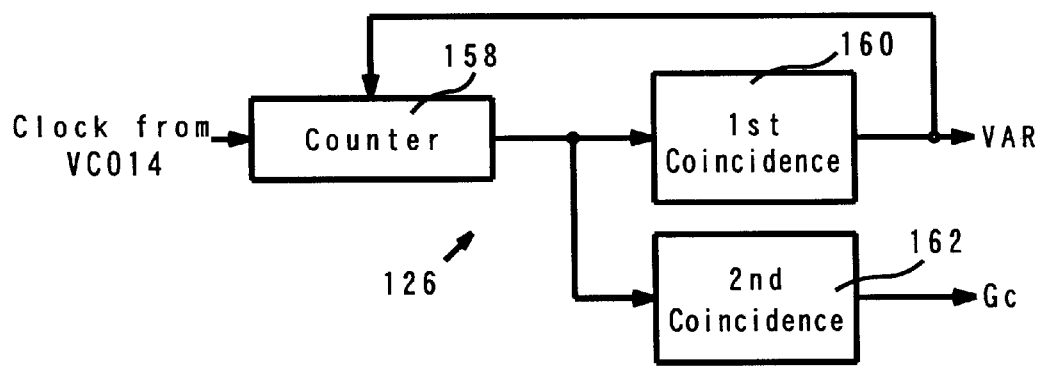
(B)
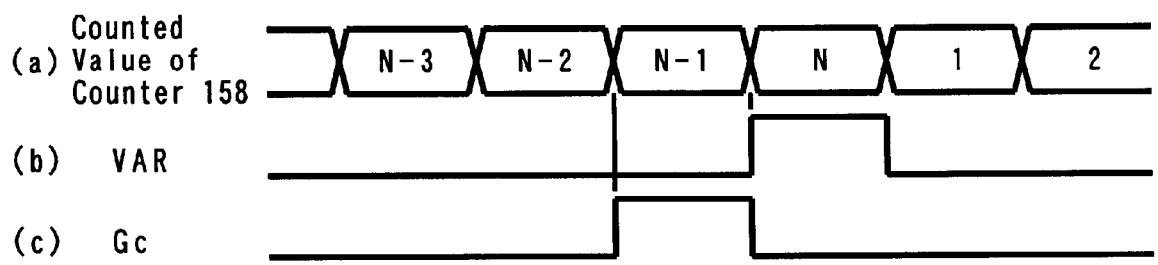

PHASE-LOCKED LOOP

TECHNICAL FIELD

The present invention relates to a phase-locked loop (hereinafter referred to as "PLL") for generating the clock (e.g., system clock) for the digital processing of the video signal from the television broadcasting station (hereinafter referred to as "TV signal"), the video signal from the video tape recorder (hereinafter referred to as "VTR" signal).

BACKGROUND ART

The PDP (Plasma Display Panel) and the LCD (Liquid Crystal Display) are now drawing public attention as a thin and lightweight display device. The display device of this type is directly driven by the digital signal, and so it requires a PLL for generating the system clock for the digital processing such as the A/D (Analog/Digital) conversion. Such a PLL is required to provide not only stable and accurate performance but also a wide clock range.

The conventional PLL circuit, as seen from FIG. 1, comprises a phase comparator 11, for comparing the reference signal REF (e.g., horizontal synchronizing signal) and a comparison signal VAR to output a phase difference signal Ph at any one of 3 levels according to the phase difference, an LFP (Low-Pass Filter), for converting the signal Ph outputted from the comparator 11 into a control voltage, a VCO (Voltage Control Oscillator) 14, for outputting to an output terminal 13 the clock whose frequency is controlled by the control voltage outputted from the LPF 12, and a loop counter 15, for dividing the frequency of the clock into 1/N (N: an integer) for feeding it back to the phase comparator 11.

The phase comparator comprises, as shown in FIG. 2, a first D flip-flop 1 (hereinafter referred to as "1D-FF"), for receiving an H-level signal (e.g., an H-level signal supplied from a Vcc power source through a pull-up resistor), which is inputted to its data terminal at an up-edge (at a rise) of a reference signal REF, which is inputted to its clock terminal, and storing the H-level signal as a Q1 output, a second D-FF 2, for receiving the H-level signal, which is inputted to its data terminal at the up-edge of a comparison signal VAR, for storing it as Q2 output, an exclusive OR gate 3, for outputting a signal Xo representing an exclusive "or" of the Q1 output of the first D-FF 1 and the Q2 output of the second D-FF 2, a 3-state inversion buffer 4, for receiving the Q2 output of the second D-FF 2 as an input signal and the output signal of the exclusive OR gate as the gate control signal Xo to output the signals of three different state, namely, H-level, L-level and Ni-Z (high impedance) as phase difference signals Ph and an NAND gate 5, for outputting a signal Na as an inverted AND signal based on the Q1 output of the first D-FF 1 and the Q2 output of the second D-FF 2.

When there is a large phase difference between the reference signal REF and the comparison signal VAR (e.g., when the phase of the reference signal VAR delays by about 4 clocks from the that of the reference signal), this produces the effect as represented by period T1 on the left-hand side in FIG. 3. That is, as shown in FIGS. 3(a) and (b), when the phase of the comparison signal VAR delays largely from that of the reference signal REF, the Q1 and Q2 outputs respectively from the first D-FF 1 and the second D-FF 2, the signal Na outputted to the reset terminals of the first D-FF 1 and the second D-FF 2 from the NAND gate 5 and the gate control signal Xo outputted from the exclusive OR gate are as shown in FIGS. 3(c), (d), (e) and (f), and thus the phase difference signal Ph outputted from the 3-state inversion buffer 4 becomes H-level (delayed phase condition) during the period Td corresponding to the phase difference as shown in (g) of the figure, causing the frequency of the clock outputted from the VCO 14 to increase by the control voltage (voltage corresponding to that has enabled the H-level to continue for period Td).

When there is a large phase difference between the reference signal REF, that is, when the phase of the comparison signal VAR is leading the phase the phase of the reference signal, the phase difference signal Ph outputted from the 3-state inversion buffer 4 becomes L-level (advanced phase state), causing the frequency of the clock outputted from the VCO 14 to decrease according to the control voltage (voltage corresponding to the continuation of L-level for the period Td) outputted from LPF 12.

Further, when the reference signal REF is omitted for some reason, the omission of the reference signal REF is detected by a circuit (not shown) to generate the reference signal which has been omitted and to input the generated reference signal REF to a phase comparator 11 through its input terminal 10, thereby preventing the occurrence of any large phase difference between the reference signal REF and the comparison signal VAR to be inputted to the phase comparator 11.

However, in the case of the prior art shown in FIG. 1, the omission of the reference signal REF is compensated by inputting the omission compensation signal to the phase comparator 11 through its input terminal 10, and, in consequence, the control voltage is applied to the VCO 14 corresponding to the phase difference during the period from the omission of the reference signal REF to the supply of the omission compensation signal. This gives rise to a problem that it is difficult to supply stable clock if VCO 14 having a very wide frequency variation range is used.

Further, where the phase difference between the reference signal and the comparison signal is approximate to 0, if there occurs a time lag between the phase information (phase information Q1 and phase information Q2) and the gate control signal Xo from the 3-state inversion buffer 4, this causes a problem that the phase difference signal Ph accurately corresponding to the phase difference cannot be obtained from the output side of the 3-state inversion buffer 4.

Also, there has been another problem that too small phase difference causes the 3-state inversion buffer 4 to become unable to respond to such a small phase difference.

For instance, as represented by the period T2 on the right-hand sides in FIGS. 3(a) and (b) respectively, when the phase of the comparison signal VAR delays slightly from the phase reference signal REF, the H-level period td of the gate control signal Xo, to be outputted to the 3-state inversion buffer gate 4 from the exclusive OR gate, becomes as short as the period shown in (f) of the same figure. In consequence, there occurs a time lag between the phase information (Q1, Q2) and the gate control signal Xo due to the delay of the transmission of the signal, and, when the phase information Q1 and Q2 will not vary as represented by the waveforms on the right-hand sides of FIGS. 3(c) and (d), the phase difference signal Ph, outputted from the 3-state inverse buffer 4, remains in the state represented by Hi-Z shown in (g) of the same figure, causing a problem that the phase difference signal corresponding to the phase difference cannot be obtained.

Therefore, as shown in FIG. 4, the control voltage corresponding to the phase difference cannot be obtained near the phase difference of 0, causing the occurrence of jittering and the resulting difficulty in supplying stable clock when the VCO 14 having an extremely wide frequency variation range is used.

The present invention is made in consideration of the above problems of the prior art and is designed to provide a PLL circuit capable of supplying stable clock even when a VOC having a very large frequency variation range is used.

More particularly, the object of the present invention is to provide a PLL circuit capable of supplying stable clock by effectively compensating for the omission of the reference signal even when a VOC having a very wide frequency variation range is used.

Further, another object of the present invention is to provide a PLL circuit capable of outputting an accurate phase difference signal corresponding to the phase difference to the VOC side from the phase comparator in order to supply stable clock even when the phase difference between the reference signal and the comparison signal is close to 0 even in the case where a VOC having a very wide frequency variation range is used.

DISCLOSURE OF THE INVENTION

The present invention relates to a PLL, comprising a phase comparator, for comparing reference signal with comparison signal to output a signal corresponding to phase difference, a loop filter, for outputting control signal according to the signal outputted from the phase comparator, a voltage controlled oscillator, for outputting a clock having a frequency corresponding to the control voltage outputted from the loop filter, and a loop counter for dividing the frequency of the clock outputted from the voltage controlled oscillator into 1/N (N: an integer) to feed it back as a comparison signal to the phase comparator, wherein there are further provided a prediction window circuit, for outputting a prediction window signal for predicting the point of generation of the reference signal, and an omission compensation circuit for detecting the omission of the reference signal at the time when the prediction window signal is outputted, outputting a first correction signal to compensate for the omission and outputting a second correction signal to offset the phase difference between the comparison signal and the first correction signal.

When there is an omission of the reference signal, the omission compensation circuit detects the omission of the reference signal at the time of the output of the prediction window signal to output the first correction signal for correcting the omission and the second correction signal for offsetting the phase difference between the comparison signal and the first correction signal, while the phase comparator outputs a signal corresponding to the phase difference between the comparison signal and the first correction signal and the signal corresponding to the phase difference between the first correction signal and the second correction signal.

Thus, even when the control voltage to be applied to the VOC is disturbed due to the omission of the reference signal, such disturbance can be offset by the control voltage applied to the VOC according to the phase difference signal between the first correction signal and the second correction signal. Therefore, even if the reference signal is omitted, the omission can be compensated effectively, so that stable clock can be supplied even in the case where the VCO having a very wide frequency variation is used.

Further, in the PLL according to the present invention, the omission compensation circuit comprises mainly an omission period meter, for measuring the omission period of the reference signal on the bases of the prediction window signal and the comparison signal, and a correction signal generator for outputting the first and the second correction signals on the bases of the prediction window signal, the reference signal and the measured value of the omission period meter; the phase comparator comprises a first D-flip-flop, for receiving the reference signal as an input to its clock terminal and the L-level voltage as an input to its data terminal, the second D-flip-flop, for receiving the comparison signal as an input to its clock terminal and H-level voltage as an input to its data terminal, a first 3-state buffer, for receiving the Q output of the first D-flip-flop as an input to output the first phase difference signal, a second 3-state buffer, for receiving, the Q signal from the second D-flip-flop as an input to output the second phase difference signal, and a control circuit not only for controlling the first and the second 3-state buffers in active state according to the inverted signal of the Q output of the first D-flip-flop but also for controlling the first and the second 3-state buffers in inactive state according to the inverted signal of the AND signal based on the inverted signal of the Q output of the first D-flip-flop and the Q output of the second D-flip-flop; the first D-flip-flop is reset by the first correction signal, and the second D-flip-flop is reset by the second correction signal.

By adopting the composition as is described above, the composition of the omission compensation circuit and the composition of the phase comparator can be simplified.

Further, in the case of the PLL according to the present invention, the omission period meter is provided with an up-down counter for counting the clocks outputted from clock generation circuit, whereby the correction error at the time of the occurrence of the omission of the reference signal can be reduced by up-counting according to the comparison signal, while down-counting according to the prediction window signal.

Further, in the PLL according to the present invention, the correction signal generator comprises a decoder for decoding that the counted value of the up-down counter has reached a set value, a 1-clock delayer for delaying by 1 clock the output signal of the decoder against the clock to be outputted from the clock generation circuit and a selector for selectively and alternately outputting the signal form the decoder and the signal from the 1-clock delayer according to each output of the prediction window signal, whereby the accumulation of the correction errors due to continuous omission of the reference signal can be prevented by outputting the second correction signal according to the output signal of the selector, the prediction window signal and the reference signal.

Further, in the case of the PLL according to the present invention, the loop counter comprises a counter for counting the clock outputted from the voltage control oscillator, a coincidence circuit, for outputting a coincidence signal when the counted value of the counter coincides with the second set value, and a delay circuit for generating a gate control signal by delaying the output of the coincidence circuit by 1 clock, thereby enabling the first set value to be inputted to the data input terminal of the counter, the output signal from the ripple carry terminal of the counter to be delayed by 1 for output not only as a comparison signal but also as an input signal to the load terminal of the counter. Further, the phase comparator is provided with a third D-flip-flop for receiving the gate control signal as an input to its clock terminal and the H-level signal as an input to its data terminal, while the control circuit control, in active state, the first and the second 3-state buffers according to the OR signal based on the inverted signal of the Q output of the fist D-flip-flop and the Q output of the third D-flip-flop.

With the composition as is described above, the omission of the first transition of the phase information supplied to the 3-state buffer can be prevented, and a good linearity can be maintained between the phase difference and the control voltage even when the phase difference between the reference signal and the comparison signal is near 0.

Further, in the PLL according to the present invention, the control circuit comprises an inverter, for inverting the Q output of the first D-flip-flop, a fourth D-flip-flop, for receiving the output signal of the inverter as an input to its clock terminal, H-level voltage as an input to its data terminal and Q output as a gate signal of the first and the second 3-state buffers, an NAND gate, for inverting, for output, the AND signal based on the output signal of the inverter and the Q output of the second D-flip-flop, and a first delayer for delaying the output signal of the NAND gate by a set time period Td1 for output to the reset terminal side of the fourth D-flip-flop.

With the composition as is described above, the omission of the first transition of the phase information supplied to the 3-state buffer can be prevented to improve the performance of the system.

Further, in the PLL according to the present invention, the control circuit comprises an inverter, for inverting the Q output of the first D-flip-flop, an OR gate, for outputting the OR signal based on the output signal of the inverter and the Q output of the third D-flip-flop, the fourth D-flip-flop, for receiving the output signal of the OR gate as an input to its clock terminal, the H-level voltage as an input to its data terminal and the Q output as a gate signal of the first and the second 3-state buffers, an NAND gate, for inverting, for output, the AND signal based on the output signal of the inverter and the Q output of the second D-flip-flop, and the first delayer for delaying the output signal of the NAND gate by set time period Td1 for output to the reset terminal side of the fourth D-flip-flop.

With the composition describe above, the omission of the last transition of the phase information supplied to the 3-state buffer can be prevented for improving the performance of the system.

Further, in the PLL according to the present invention, the erroneous operation of the first and the second 3-state buffer can be prevented by providing the control circuit with a second delayer for delaying the output signal of the first delayer by a set time period Td2 for output to the set terminal of the first D-flip-flop and for output to the reset terminal of the second D-flip-flop through the AND gate, while inputting the first correction signal to the other input side of the AND gate.

Further, in the PLL according to the present invention, the erroneous operation of the first and the second 3-state buffers can be prevented by providing the control circuit with the second delayer for delaying the output signal of the AND gate by a set time period Td2 for output to the set terminal of the first D-flip-flop and the reset terminal of the third D-flip-flop through the second AND gate and by inputting the first correction signal to the other input side of the second AND gate.

Further, in the PLL according to the present invention, the loop filter is made to comprise a complete integral loop filter with an operational amplifier; the first phase difference signal and the second phase difference signal are input to one input side of the operational amplifier; the divided voltages of the H-level reference voltage and the L-level reference voltage are input to the other input side to output the control voltage from the output side to the VCO. When both the first phase difference signal and the second phase difference signal are at the H-level or L-level, the control voltage for decreasing or increasing the oscillation frequency is output to the voltage control oscillator, while, when either one of the first phase difference signal or the second phase difference signal is at H-level or L-level or the both have a high impedance, the control voltage for maintaining the oscillation frequency is output to the voltage controlled oscillator.

With the composition as is described above, the voltage level for the plus operation and the minus operation ranging from intermediate voltage can be balanced completely, thereby equalizing the pull-in response from the phase delay and the pull-in response from the phase advance.

In the PLL according to the present invention comprising the phase comparator, loop filter, VCO and loop counter, there are further provided a gate control signal generation circuit, for generating the gate control signal whose phase is leading the phase the comparison signal by 1 to output to the phase comparator the signal of 3 different states according to the phase difference between the reference signal and the comparison signal, and the 3-state buffer to be controlled in active state by the control signal.

Since the gate control signal for activating the 3-state buffer is generated by letting the phase of the comparison signal advance by about 1 clock, the point at which the activation of the 3-state buffer is started can be made earlier by about 1 clock compared with the case of the prior art.

Therefore, even if the time lag occurs between the phase information and the gate control signal of the 3-state buffer gate, the omission of the first transition of the phase information to be supplied to the 3-state buffer can be prevented to establish a good linearity between the phase difference and the control voltage even at the point where the phase difference is near 0, whereby the stable clock can be supplied even when the VCO having a very large frequency variation range is used.

Further, in the PLL according to the present invention, the phase comparator comprises a first D-FF, for receiving the reference signal as an input to its clock terminal and the L-level voltage as an input to its data terminal, a second D-FF, for receiving the comparison signal as an input to its data terminal and the H-level voltage as an input to its data terminal, a third D-FF, for receiving the gate control signal as an input to its clock terminal and the H-level signal as an input to its data terminal, a first 3-state buffer, for receiving the Q output of the firs D-FF as an input to output the first phase difference signal (3-state signal), a second 3-state buffer, for receiving the Q output of the second D-FF to output the second phase difference signal (3-state signal), and the control circuit not only for controlling, in active state, the first and the second 3-state buffers according to the OR signal based on the inverse signal of the Q output of the first D-FF and the Q output of the third D-FF but also for controlling, in inactive state, the first and the second 3-state buffers according to the inverted signal of the AND signal based on the inverted signal of the Q output of the first D-FF and the Q output of the second D-FF.

With the composition as is described above, the composition of the phase comparator can be simplified.

Further, in the PLL according to the present invention, the control circuit comprises an inverter, for inverting the Q output of the first D-FF, an OR gate, for outputting the OR signal according to the output signal of the inverter and the Q output of the third D-FF, a fourth D-FF, for receiving the output signal of the OR gate as an input to its clock terminal, the H-level signal as an input to its data terminal and the Q output for output as the gate control signal to the first and the second 3-state buffers an NAND gate, for outputting an inverted signal of the AND signal according to the output signal of the inverter and the Q output of the second D-FF, and a first delayer for delaying the output signal of the NAND gate by a set time period t1 for output to the reset terminal of the fourth D-FF.

With the composition as is described above, the last transition of the phase information to be supplied to the 3-state buffer can be prevented from being omitted to improve the performance of the system.

Further, in the PLL according to the present invention, the control circuit is provided with a second delayer, for not only delaying the output signal of the first delayer by a set time period t2 for outputted to the set terminal of the first D-FF and to the reset terminal of the second D-FF, whereby the first D-FF can be set and the second and the third D-FF's can be reset after making the first and the second 3-state buffers inactive to prevent the erroneous operation of the first and the second 3-state buffers.

Further, in the PLL according to the present invention, the loop filter comprises a complete integral loop filter with an operational amplifier so that the first phase difference signal and the second phase difference signal are inputted to one input side of the operational amplifier, while the divided voltages of the H-level reference voltage and the L-level reference voltage are inputted to the other input side, to output the control voltage from its output side to the VCO. Further, when both the first phase difference signal and the second phase difference signal are at H-level or L-level, the control voltage is outputted to the voltage control oscillator to decrease or increase the oscillation frequency; when either one of the first phase difference signal or the second phase difference signal is at H-level while the other is at L-level, or when the both have a high impedance, the control voltage for maintaining the oscillation frequency is outputted to the voltage controlled oscillator.

With the composition as is described above, the voltage levels of plus operation and the minus operation ranging from an intermediate voltage level are completely balanced, thereby enabling the pull-in response from the delayed phase and the pull-in response from the advanced phase can be equalized.

Further, in the PLL according to the present invention, the loop counter comprises a counter, for counting the clocks outputted from the VCO, a first coincidence circuit, not only for outputting the comparison signal obtained by dividing the frequency of the clock into 1/N but also for outputting the comparison signal to the reset terminal of the counter when the counted value of the counter coincides with the set value N, and a second coincidence circuit for outputting the gate control signal obtained by dividing the clock signal into 1/N when the counted value of the counter coincides with the set value (N–1).

With the composition as is described above, the gate control signal generating circuit is incorporated into the loop counter to simplify the composition of the circuit.

BRIEF DESCRIPTION OF THE DRAWINGS

FIG. 6 is a circuit diagram of the complete integral loop filter shown in FIG. 5.

FIG. 7 is a diagram illustrating the loop counter 22 in FIG. 5, wherein (A) is a block diagram, and (B) is a timing chart for explaining the function of the loop counter 22 in (A).

FIG. 17 is a timing chart for explaining the loop counter 126 in FIG. 15, wherein (A) is a block diagram, and (B) is a timing chart for explaining the function of the loop counter 126 in (A).

BEST MODE FOR CARRYING OUT THE INVENTION

The present invention will be explained in detail in the following referring to accompanying drawings.

Figure 1:
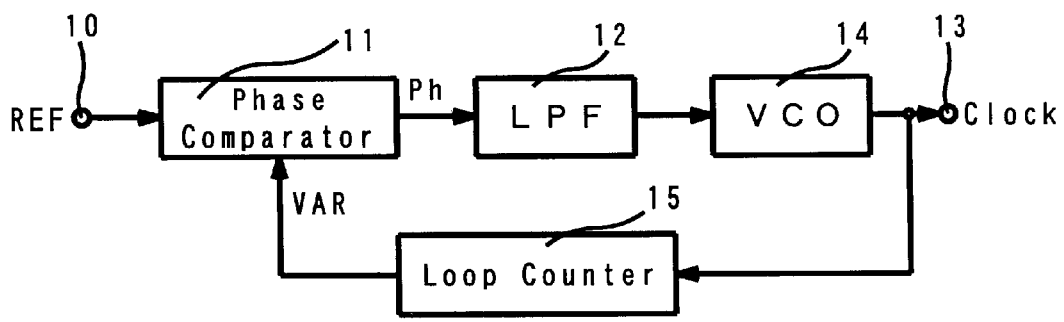
FIG. 1 is a block diagram showing a PLL according to the prior art.
Figure 2:
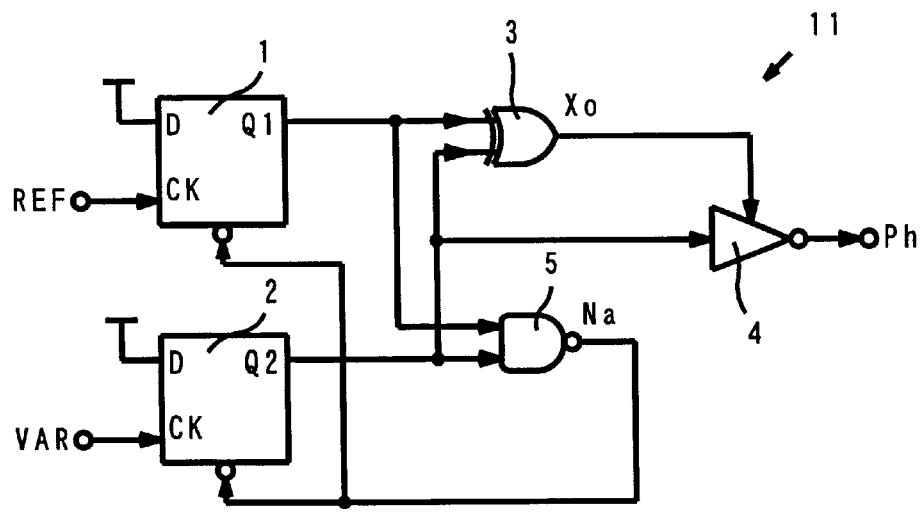
FIG. 2 is a block diagram showing the phase comparator 11 in FIG. 1.
Figure 3:
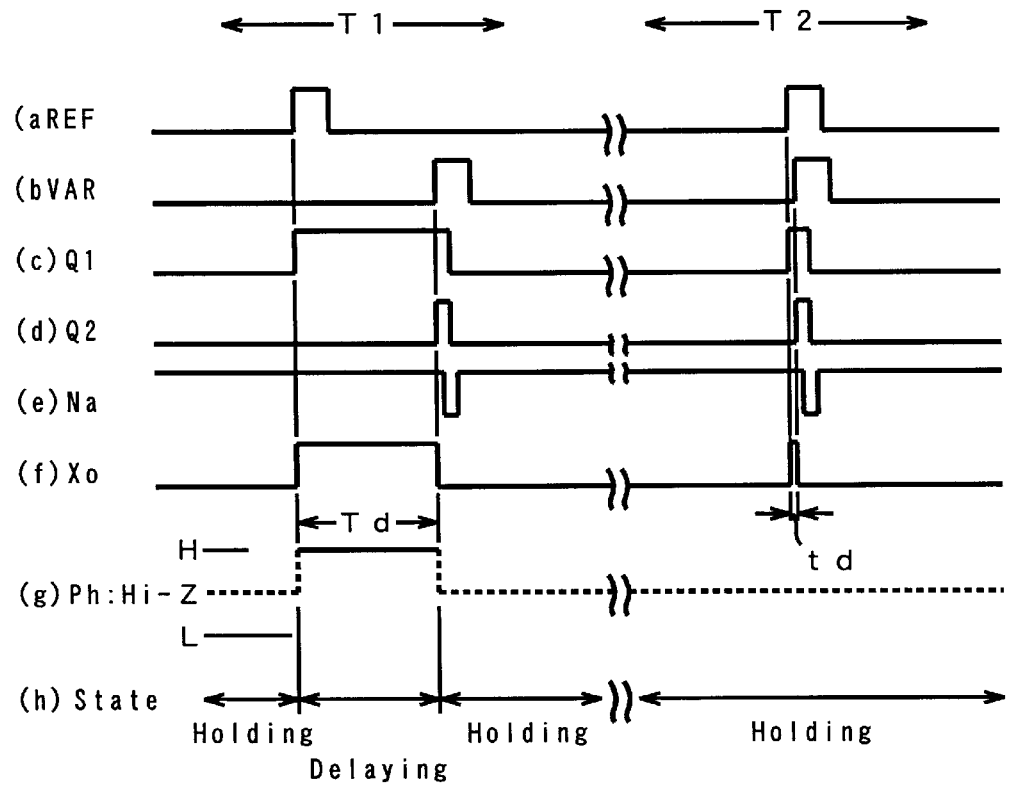
FIG. 3 is a timing chart for explaining the operations of the components shown in FIG. 1 and FIG. 2 respectively.
Figure 4:
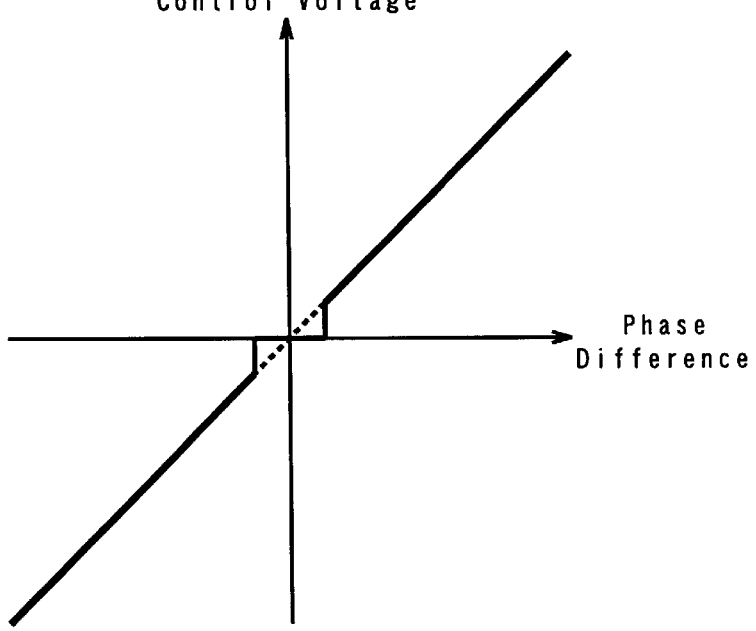
FIG. 4 is a characteristic diagram showing the relationship among the reference signal REF, the phase difference between the reference signal and the comparison signal and the control voltage applied to the VCO from the LPF.
Figure 5:
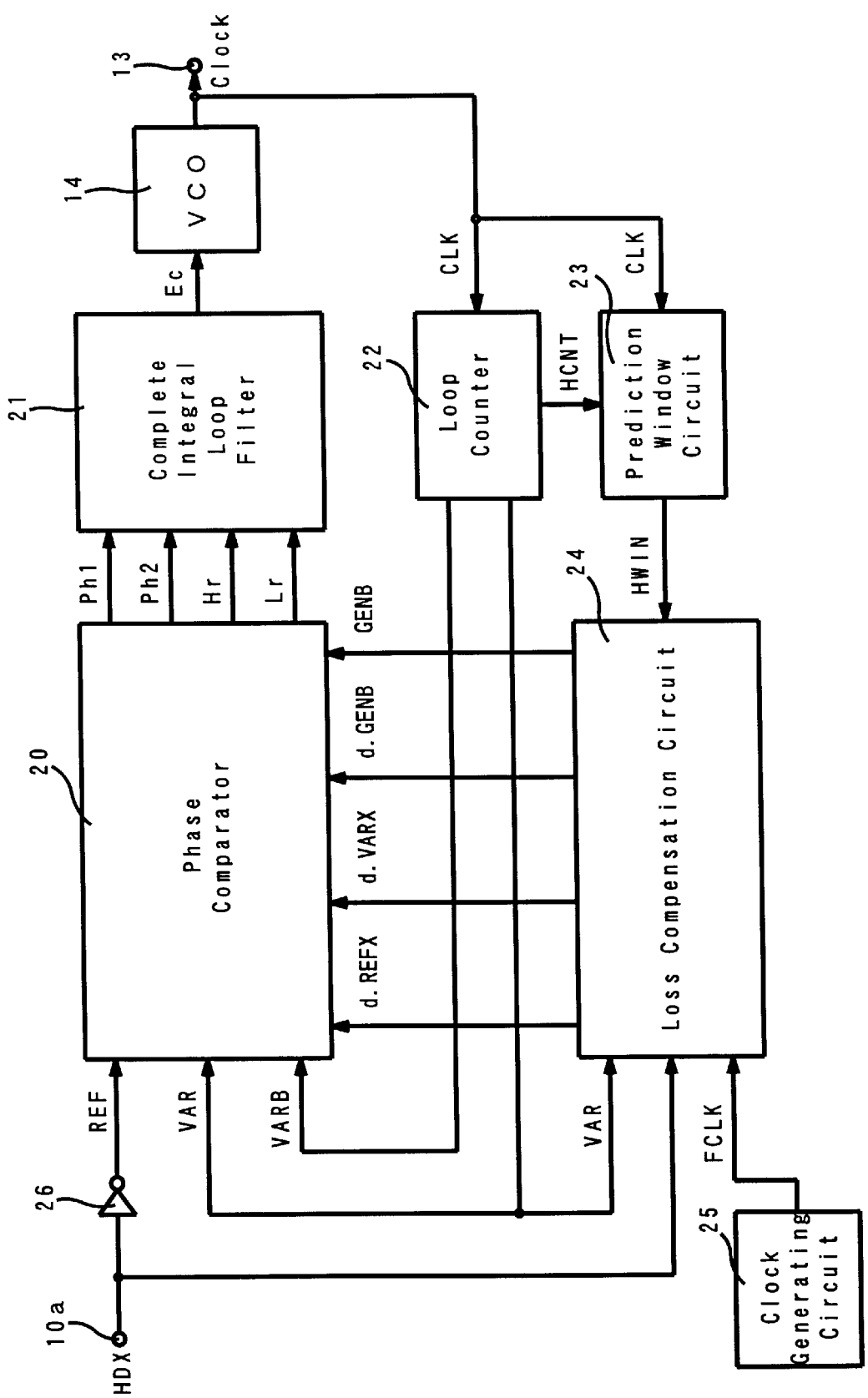
FIG. 5 is a block diagram of the PLL as the first embodiment of the present invention.

FIG. 5 shows the PLL as the first embodiment of the present invention. In this figure, those parts common to the parts shown in FIG. 1 and FIG. 2 are assigned the common numerals and characters.

In FIG. 5, the numeral 20 represents the phase comparator; 21, the complete integral loop counter; 23, the prediction window circuit; 24, the omission compensation circuit; 25, the clock generating circuit; 26, the inverter.

The clock generating circuit 25 comprises a quartz-crystal oscillator or the like and outputs a clock FCLK (hereinafter referred to as "FCLK") having a fixed frequency (e.g., 28.636 MHz).

The inverter 26 inverts the horizontal synchronizing signal HDX (hereinafter referred to as "HDX"), inputted to its input terminal 10a, into the reference signal REF (hereinafter referred to as "REF") for output to the phase comparator 20.

The complete integral loop filter, as shown in FIG. 6, comprises a operational amplifier 30, resistors R1–R5 and capacitors C1–C3, inputs the first phase difference signal Ph1 (hereinafter referred to as "Ph1") and the second phase difference signal Ph2 (hereinafter referred to as "Ph2"), outputted from the phase comparator 20, to the minus side of the operational amplifier 30 through the resistors R1 and R2, inputs the reference voltages Hr and Lr, outputted from the phase comparator 20 and divided by the resistors Re and R4 and smoothed by the capacitor C3, are outputted to the plus side of the operational amplifier 30 and feeds back the output of the operational amplifier 30 through the resistor R5 and the capacitors C1 and C2 to the minus side to output the control voltage Ec to the VCO 14. That is, when both Ph1 and Ph2 are at H-level or L-level, control voltage Ec for decreasing or increasing the oscillation frequency of the clock is outputted to the VCO 14, and, when either one of the Ph1 and Ph2 is H-level while the other is L-level, or when the both have high impedance Hi-z (hereinafter referred to as "Hi-z"), the control voltage for maintaining the oscillation frequency is outputted to the VCO 14.

The loop counter 22 comprises, as shown in FIG. 7, a counter 31, for receiving the value, obtained by subtracting "2" from a set value N and inverted (a first set value), as an input to its D-terminal, and for counting the clock CLK (hereinafter referred to as "CLK") outputted from the VCO 14, a coincidence circuit 32, for outputting the coincidence signal when the counted value HCNT (hereinafter referred to as "HCNT") coincides with the set value FFEh (the second set value), a D-flip-flop 33 (hereinafter referred to as "D-FF"), for delaying the coincidence output of the coincidence circuit 32 by 1 CLK to output the gate control signal VARB (equivalent to the signal made available by advancing the phase of the comparison signal VAR, which will be described later, by 1 CLK), and D-FF 34 for delaying the output signal from the ripple carry terminal RC of the counter 31 by 1 CKL for output as the comparison signal VAR (hereinafter referred to as "VAR") to the load terminal LO of the counter 31.

Figure 8:
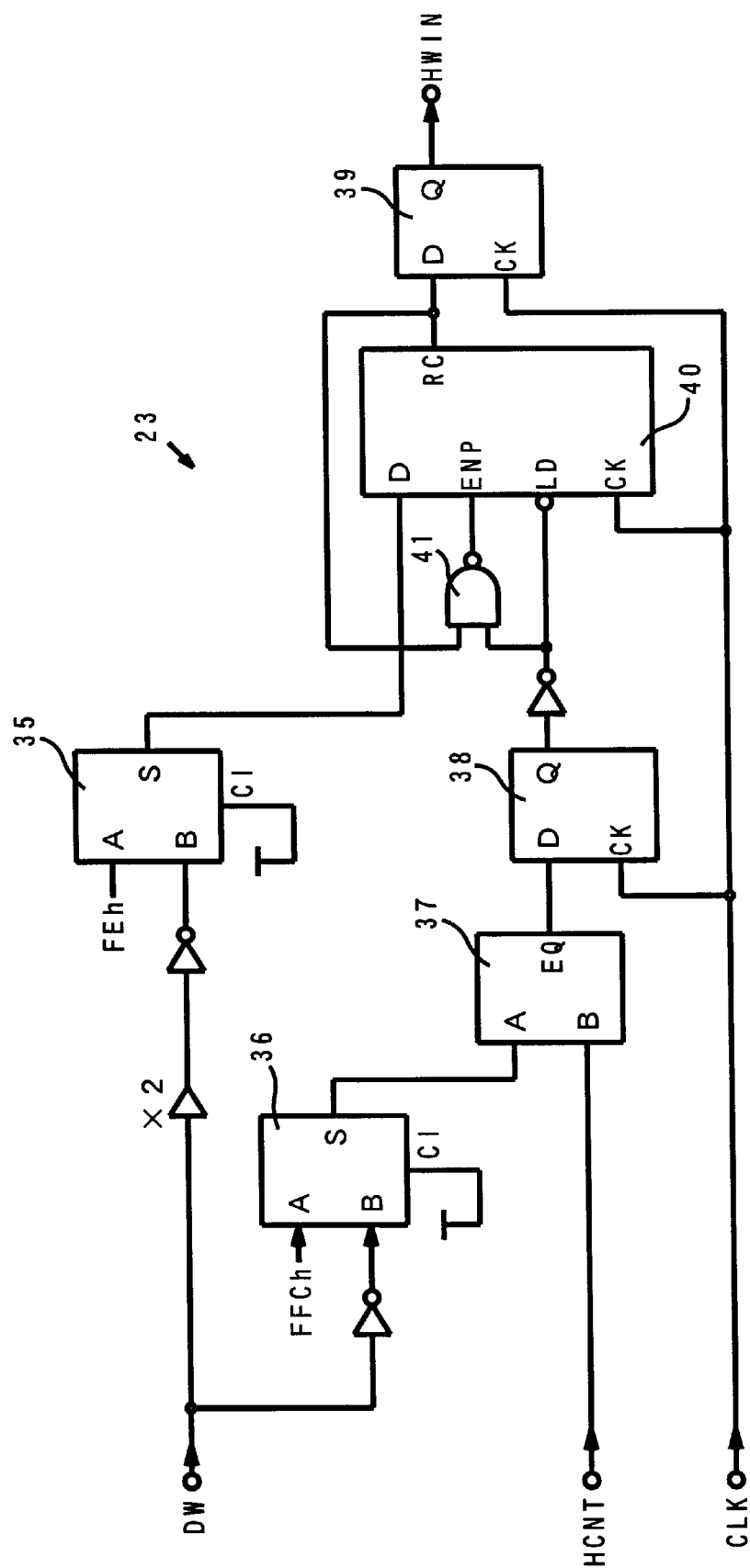
FIG. 8 is a block diagram of the prediction window circuit 23 in FIG. 5.

The prediction window circuit 23 comprises mainly, as shown in FIG. 8, adders 35, 36, the coincidence circuit 37, the D-flip-flops 38, 39 (hereinafter referred to as "D-FF") and the counter 40.

One adder 35 outputs the sum S (e.g., EEh) of the value, obtained by doubling and inverting the set detection window width DW (e.g., 08 h in terms of hexadecimal digit), set value FEh and the value of carry-in CI, to the data terminal D of the counter 40. The other adder 36 outputs the sum S (e.g., FF4h) of the inverted value of the detection window width DW (e.g., FF7h), the set value FFCh and the value of the carry-in CI to one input side of the coincidence circuit 37.

The coincidence circuit 37 outputs the coincidence signal EQ when the HCNT of the loop counter 22 coincides with the sum S (e.g., FF4h) of the adder 36, and the D-FF 38 latches the coincidence signal EQ at the rise of the CLK for making Q output.

The counter 40 receives the signal obtained by inverting the Q output of the D-FF 38, as an input to its load terminal, receives the data (input data to terminal D) at the rise of the CLK when the level of the input to this load terminal LD has become L-level and outputs the H-level signal from the ripple carry terminal RC when counted value has become FFh. When the H-level signal is outputted from the carry terminal RC, the L-level signal is inputted to the enabling terminal ENP of the counter 40 through the NAND gate 41 to make the counter 40 inactive.

The D-FF 39 latches the signal outputted from the carry terminal RC of the counter 40 at the rise of the CLK and outputs it as prediction window signal HWIN (hereinafter referred to as "HWIN").

Figure 9:
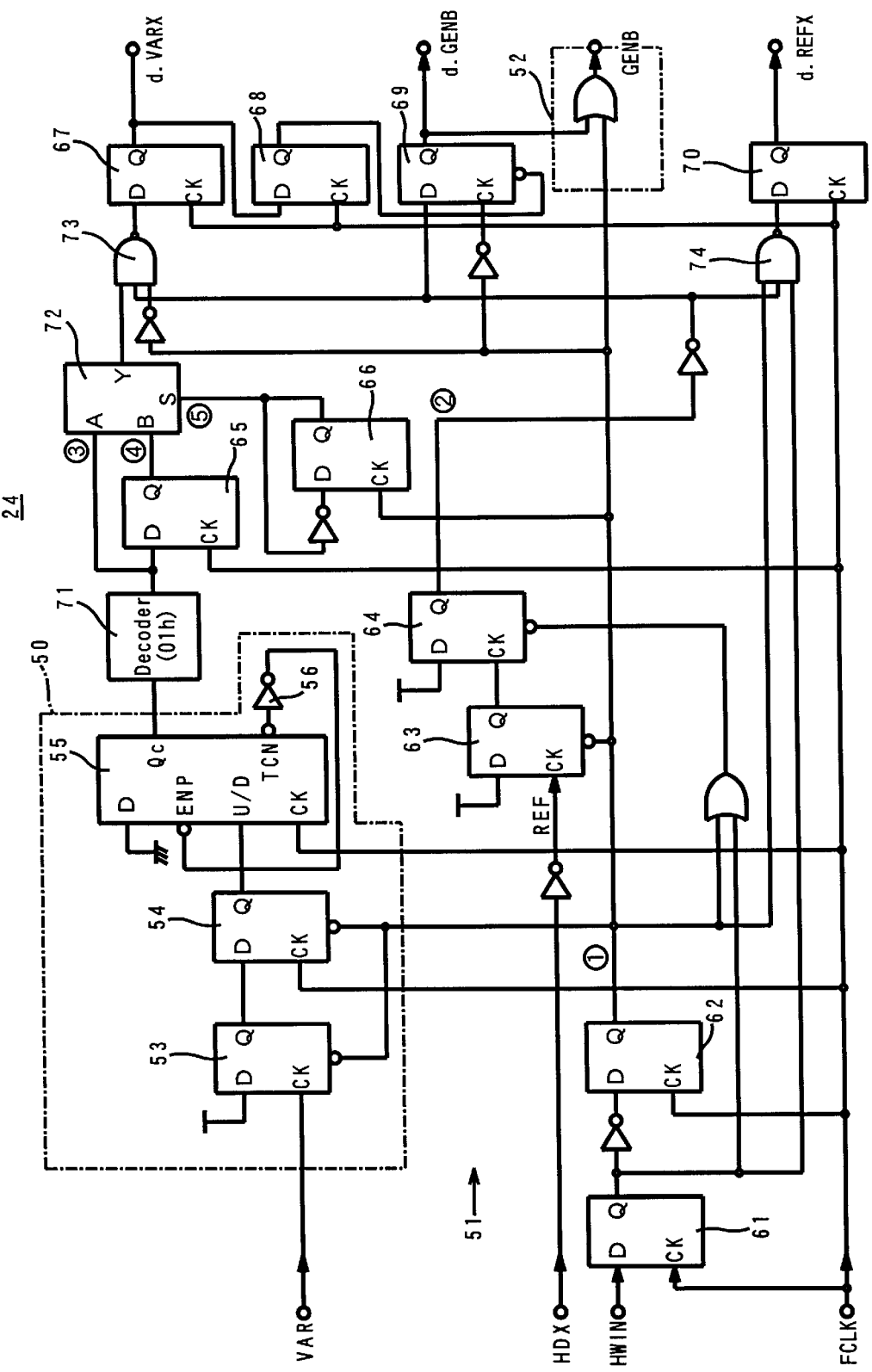
FIG. 9 is a block diagram showing the omission compensation circuit 24 in FIG. 5.

The omission compensation circuit 24 comprises, as shown in FIG. 9, an omission period meter 50, a correction signal generator 51 and a phase comparison period signal generator 52.

The omission period meter 50 comprises main components D-FF 53, D-FF 54 and up-down counter 55.

The D-FF 53 receives, for storing as Q output, the input of the H-level voltage (e.g., the voltage supplied from the Vcc power source through the pull-up resistor), inputted to the data terminal, at the up-edge of the VAR inputted to the clock terminal; the D-FF 54 receives, for storing as Q output, the input of the Q output of the D-FF 53 at the up-edge of the FCLK outputted from the clock generation circuit 25. The D-FF 53 and D-FF 54 are reset when the signal 1, which will be described later, is at L-level.

The up-down counter 55 operates as an U/D (up/down) counter when the Q output of the D-FF 54 is at H/L level to output the counted value Qc of the FCLK. When the counted value Qc in up-counting has become FFFh, the signal outputted from the carry terminal TCN changes to L-level, and this signal is fed back to the enabling terminal ENP through the inverter 56 for self-stop. Further, when the counted value in down-counting has become 000h, the signal outputted from the carry terminal TCN changes to L-level to feed back the signal to the enabling terminal ENP through the inverter 56 for self-stop.

The correction signal generator 51 comprises the components similar to those of the composition shown in FIG. 9 but not including the omission period meter 50 and the phase comparison signal generator 52, that is, mainly comprises the D-FF's 61–70, decoder 71, selector 72, NAND gates 73 and 74.

The D-FF 61 receives the input of the HWIN at the up-edge of the FCLK to store it as Q output, while the D-FF 62 receives the input of the signal, obtained by inverting the Q output of the D-FF 61 at the up-edge of the FCLK to store it as Q output (signal 1 in the figure).

The D-FF 61 receives the input of the H-level voltage according to the signal, obtained by inverting the HDX, to store it as the Q output, while the D-FF 64 receives the input of the H-level voltage according to the Q output of the D-FF 63 to store it as Q output (signal ② in the figure). The D-FF 63 is reset when the signal 1 is at L-level, while the D-FF 64 is reset when the Q output of the D-FF 61 is L-level, and the signal ① is at L-level.

The decoder 71 outputs the decode signal (signal ③ in the figure) when the counted value Qc of the up-down counter 55 has become 001 h (hereinafter referred to as "01 h").

The D-FF 65, an example of the 1-clock delayer, receives the input of the decode signal from the decoder 71 at the up-edge of the FLCK and stores it as Q output (signal ④ in the figure), while the D-FF 66 stores the Q output (select signal ⑤ in the figure) to be inverted to H-level (or) L-level at each up-edge of the signal ①.

The selector 72 selects the signals ④ and ③ depending on the H-level or L-level of the select signal ⑤ for output as Y-signal.

The NAND gate 73 outputs the signal, obtained by inverting the AND signal based on the inverted signals of Y-signal and signal ① and inverted signal of the signal ②, while the NAND gate 74 outputs the signal, obtained by inverting the AND signal based on the Q output of the D-FF 61 and signal ① and the inverted signal of the signal ②.

The D-FF 67 receives the input of the output signal of the NAND gate at the up-edge of the FCLK to store it as Q output, which becomes the second correction signal, dummy VARX (hereinafter referred to as "d. VARX").

The D-FF 68 receives the Q output of the D-FF 67 at the up-edge of the FCLK and outputs its own Q output to the reset terminal of the D-FF 69. The D-FF 69 receives the inverted signal of the signal ② at the up-edge of the inverted signal of the signal ① to store it as Q output, and the Q output becomes the third correction signal, the dummy GENB (hereinafter referred to as GENB).

The D-FF 70 receives the output signal of the NAND gate 74 at the up-edge of the FCLK and store it as Q output, and this Q output becomes the first correction signal, the dummy REFX (hereinafter referred to as d. REFX).

The phase comparison period signal generator 52 comprises an OR gate and outputs the AND signal based on the Q output of the D-FF 69 (the third correction signal d. GENB) as the phase comparison period signal (hereinafter referred to as GENB).

Figure 10:
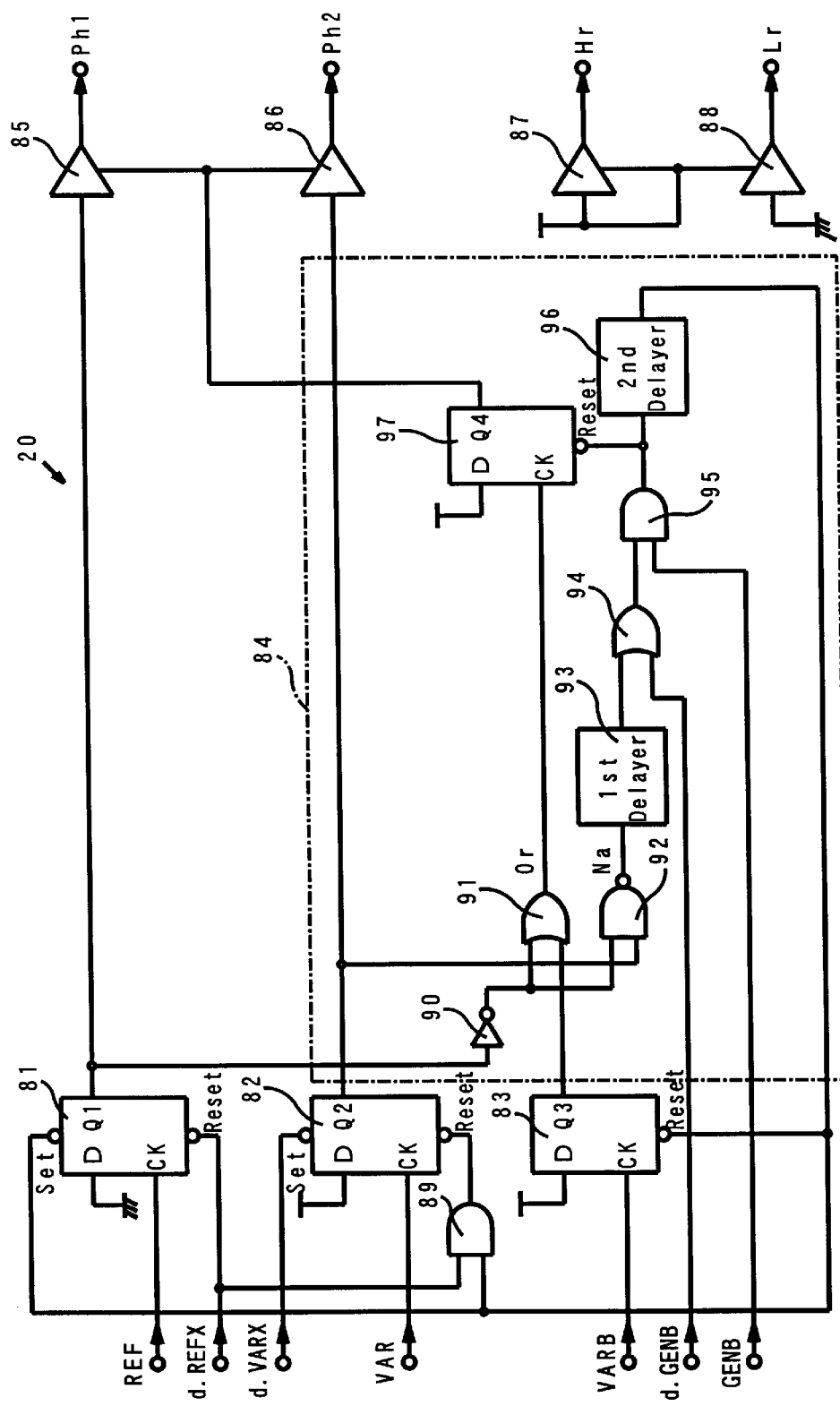
FIG. 10 is a block diagram showing the phase comparator 20 in FIG. 5.

The phase comparator 20 comprises, as shown in FIG. 10, the first, second and third D-FF's 81, 82, 83, the control circuit 84, the first, second, third and fourth 3-state buffers 85, 86, 87, 88 and 89.

The first D-FF 81 receives the input of the L-level voltage (e.g., grounding voltage) at the up-edge of the REF inputted to the clock terminal to store it as Q1 output. The second D-FF 82 receives the input of the H-level voltage, inputted to its data terminal, at the up-edge of the VAR, inputted to the clock terminal, to store it as Q2 output. The third D-FF 83 receives the input of the H-level voltage, inputted to its data terminal, at the up-edge of VARB, inputted to its clock terminal, to store it as Q3 output.

The control circuit 84 comprises an inverter 90, for inverting the Q1 output of the first D-FF 81 for output, an OR gate 91, for outputting the OR signal Or, based on the output of the inverter 90 and Q3 output, an NAND gate 92, for outputting the signal Na, obtained by inverting the AND signal based on the output of the inverter 90 and the Q2 output for output, a first delayer 93, for delaying the signal Na by a time period Td1 for output, an OR gate 94, for outputting the OR signal based on the output signal of the first delayer 93 and d.GENB, an AND gate 95, for outputting the AND signal based on the output signal of the OR gate 94 and GENB, a second delayer 96, for delaying the output signal of the AND gate by a time period Td2 for output, and a fourth D-FF 97, for receiving the input of the H-level voltage, inputted to its data terminal at the up-edge of the signal Or outputted from the OR gate 91, to store it as Q4 output.

The output side of the second delayer 96 is connected not only to the set terminal of the first D-FF 81 and the reset terminal of the third D-FF 83 but also to the reset terminal of the second D-FF 82 through the AND gate 89, while the other input side of the AND gate 89 receives the input of the d.REFX. The other rest terminal of the first D-FF 81 receives the input of the d.REFX, while the reset terminal of the second D-FF 82 receives the input of the d.VARX.

The first and the second 3-state buffers 85 and 86 receive the Q1 and Q2 outputs of the first and the second D-FF's 81 and 82 as input signals and Q4 output of the fourth D-FF 97 as the gate control signal to output the first and the second phase difference signals Ph1 and Ph2 in 3 states, namely, H-level, L-level and Hi-z. That is, when the gate signal is at H-level, Ph1 and Ph2 become H-level and L-level according to the H-level and L-level of the input signal, while Ph1 and Ph2 become Hi-z when the gate signal is at L-level.

The H-level voltage is applied to the input side of the third 3-state buffer 87; the input side of the fourth 3-state buffer 88 is grounded; the gates of the third and the fourth 3-state buffers 87 and 88 are supplied with the H-level voltage; the H-level reference voltage Hr and the L-level reference voltage Lr are outputted from the output sides of the third and the fourth 3-state buffers 87 and 88 to the complete integral loop filter 21.

Next, the function of the first embodiment will be explained referring to FIGS. 11 through 14.

A: First, how the prediction window circuit 23 outputs the HWIN will be explained referring to FIG. 8 and FIG. 11. The HWIN is a signal for predicting the point at which the REF is generated.

(i) For the convenience of the explanation, where the detection window width DV is 08h; the number N of division of the loop counter 22 is set to 800, and the CLK outputted from the VCO 14, the HCNT of the loop counter 22 and the VAR outputted from the loop counter 22 are as shown in FIGS. 11(a), (b) and (c), the coincidence circuit 37 outputs, as shown in (d) of the figure, the coincidence signal EQ when the HCINT coincides with the sum S=FF4h (FF4h is 4084 in decimal expression and is equivalent to N−12).

Figure 11:
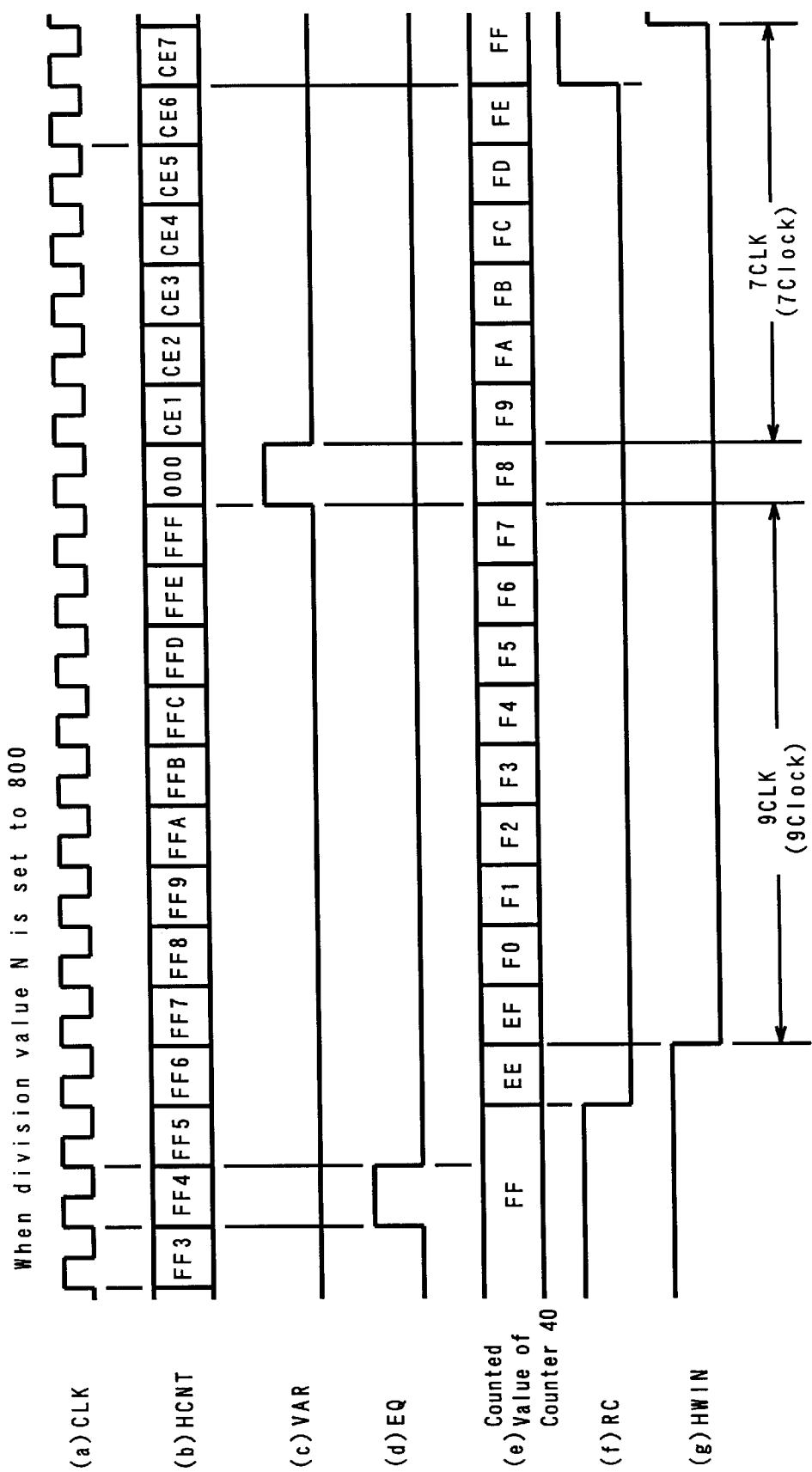
FIG. 11 is a timing chart for explaining the function of the prediction window circuit 23 in FIG. 8.

(ii) When the coincidence signal EQ is outputted from the coincidence circuit 37, since the D-FF 38 for delaying the signal by 1 CKL is provided in the subsequent stage of the coincidence circuit 37, the counter 40 is activated when the HCNT has become FF6h (FF6h is equivalent to N−10), causing not only the output of the carry terminal RC to change to L-level but also the load terminal LD to receive the input of the sum S (e.g., EEh) of the adder 35. When the counted value has become FFh as the result of the progress of the counting by the counter 40, the level of the output of the carry terminal changes to H-level to make the counter 40 inactive. Thus, the counted value of the counter 40 becomes as shown in FIG. 11 (a), while the signal outputted from the carry terminal RC of the counter 40 becomes as shown in (f) of the same figure.

(iii) Since the D-FF 39 receives the input of the signal outputted from the carry terminal RC of the counter 40 at the up-edge of the CLK and stores it as Q output (HWIN), the HWIN outputted from the prediction window circuit 23 becomes a prediction window signal corresponding to the preceding 9 CLK (clock) and the following 7 CLK, totaling 17 CLK.

B: Next, the function of the normal case where there is no omission of horizontal synchronizing signal DDX will be explained referring to FIG. 10 and FIG. 12.

(i) For convenience of explanation, as shown in FIGS. 12(c) and (d), assuming that the phase of the REF, obtained by inverting the HDX, synchronize with that of the VAR, and the HWIN is a signal as is shown in (a) of the figure, the signal ① outputted from the Q terminal of the D-FF 62 corresponds to the signal obtained by inverting and delaying by 2 FCLK the HWIN as shown in (b) of the figure. Assuming that the level of the signal ① has changed to H-level at t1 where the phases of the REV and VAR are synchronized, the level of the signal will change to L-level at t3 after the lapse of about 17 CLK.

Figure 12:
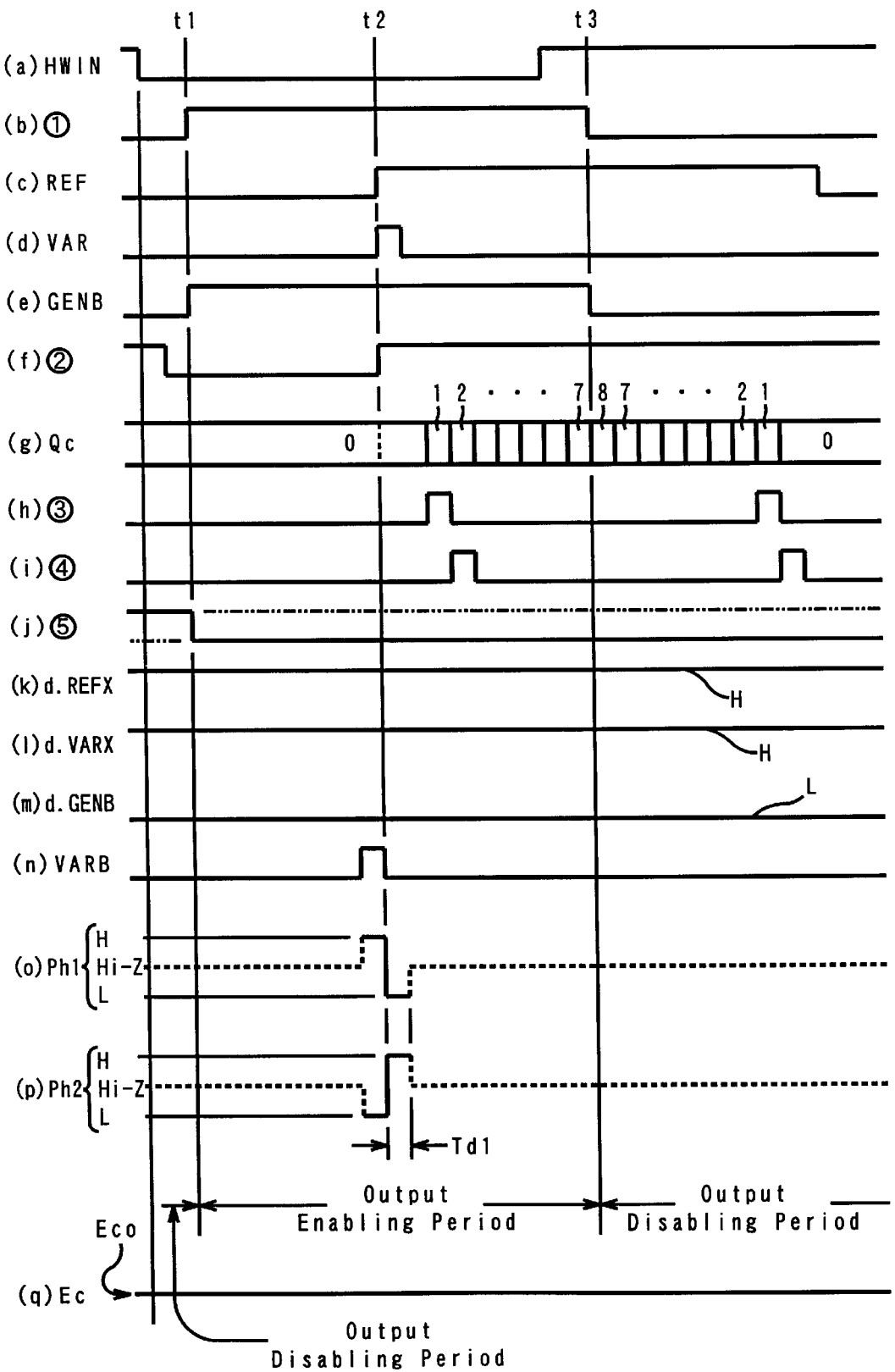
FIG. 12 is a timing chart for explaining the function of the present invention in the case where the reference signal is not omitted (i.e., HDX is not omitted).
Figure 13:
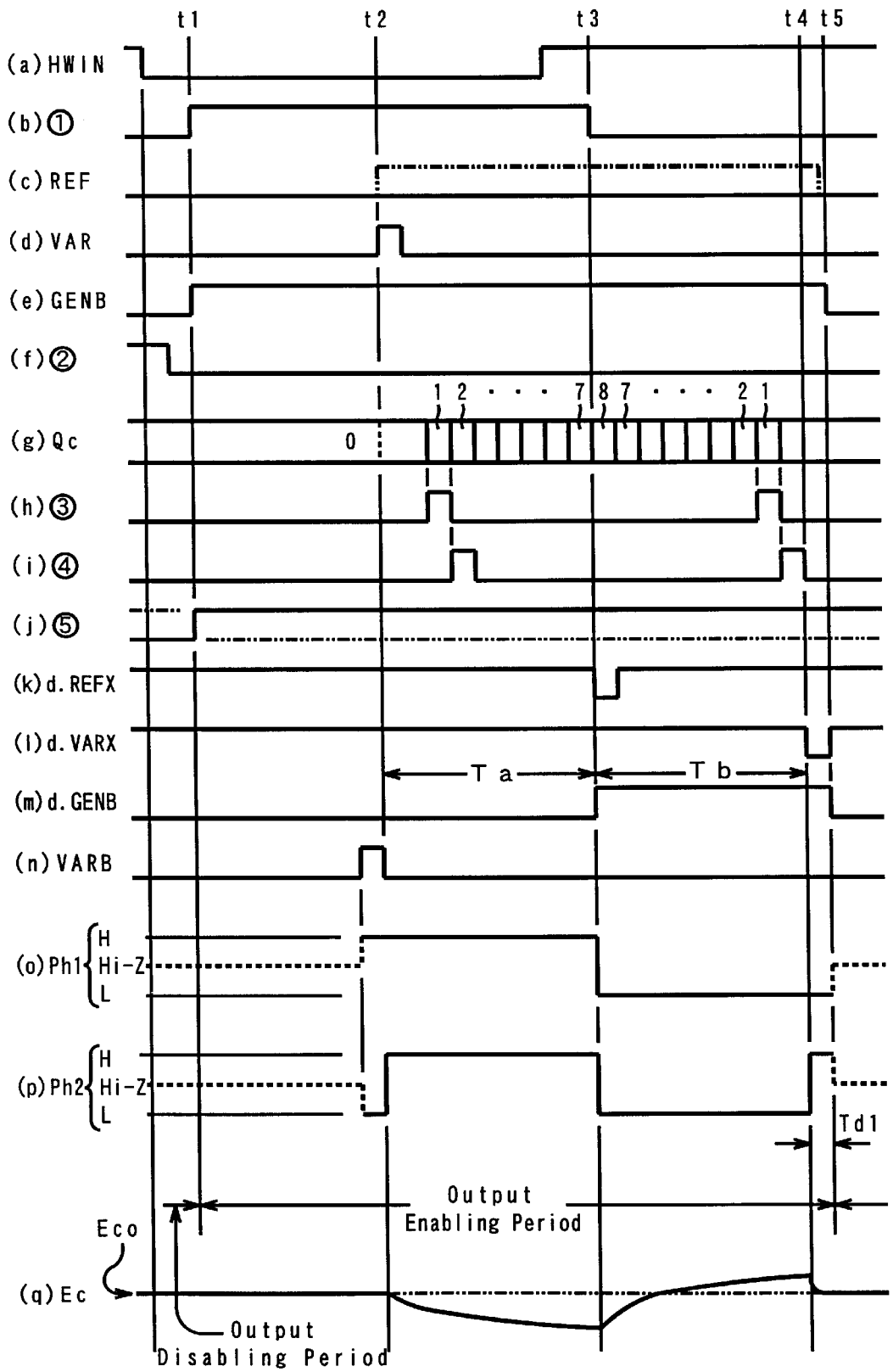
FIG. 13 is a timing chart for explaining the function of the present invention in the case where the reference signal is omitted (i.e., HDX is omitted).

(ii) In the omission compensation circuit 24 in FIG. 9, the D-FF 63 receives the input of the H-level voltage according to REF to store it as Q output, while the D-FF 64 is not only reset by the Q output of the D-FF 61 but also receives the H-level voltage to store it as Q output according to the Q output of D-FF 63, so that the signal ② outputted from Q terminal of D-FF 64 becomes as shown in FIG. 12(*f*). That is, the level of the signal ② changes to L-level at a point which is preceding t1 by 1 FCLK and changes to H-level at t2.

(iii) With the up-down counter 55, when the counted value Qc has become FFFh in the process of up-counting or when the counted value Qc has become 000h in the process of down-counting, the signal outputted from the carry terminal TCN changes to L-level and is fed back to the enabling terminal ENP for self-stop; in other cases, the signal outputted from the carry terminal TCN enters enabling state at H-level to receive the input to its data terminal, so that the counted value Qc is 000h (represented by 0 in FIG. 12(*g*); the same rule applies hereafter) at initial state. D-FF 53 receives the H-level voltage according to VAR to store it as Q output, while D-FF 54 receives the Q output of the D-FF 53 at the rise of FLCK and outputs the Q output to the U/D terminal of the up-down counter 55, so that, as shown in FIG. 12(*g*), the up-down counter enters enabling state at the time of the generation of FCLK immediately following t2 at which the VAR rises and then starts up-counting continuously from the next FCLK until the level of the signal ① changes to L-level.

(iv) When the level of the signal ① changes to L-level at t3 (corresponding to the point at which the counted value Qc varies from 7 to 8), D-FF's 53 and 54 are reset, causing the level of Q output of D-FF 54 to change to L-level and the up-down counter 55 to enter down-counting mode. Therefore, when the counted value Qc varies as shown in FIG. 12(*g*) to become 000h, the level of the signal outputted form the carry terminal TCN changes to L-level for self-stop.

(v) The decoder 71 decodes 01h (given as "1" in FIG. 12(*g*)) of the counted value Qc of the up-down counter 55 to output the signal ③ as is shown in FIG. 12(*h*), while the D-FF 65 outputs the signal ④, obtained by delaying by 1 FCLK the signal ③ as is shown in (i) of the same figure.

D-FF 66 outputs to the selector 72 the Q output, which is inverted at each up-edge of the signal ①, as select signal ⑤, so that, when the signal ⑤ is at L-level as indicated with a solid line in FIG. 12(*j*), the selector 72 selects the signal ③ to output it as Y-signal and selects signal ④ to output it as Y-signal when the signal ⑤ is at H-level as shown with 2-dot-dash line in (*j*) of the same figure.

(vi) The output side of the NAND gate becomes L-level only when the Y-signal is at H-level (with signal ④ outputted), and the inverted signals of the signals ① and ② are at H-level, while remaining at H-level under other conditions, and thus the d.VARX will continue to remain at H-level as shown in FIG. 12(*l*).

Further, the output side of the NAND gate becomes 1-level only when the signal, obtained by delaying HWIN by 1 FCLK, is at H-level, the signal ① and the inverted signal of the signal ② are at H-level respectively, while remaining at H-level under other conditions, the d.REFX continues to remain at H-level as shown in FIG. 12(*k*).

Further, D-FF 69 receives the inverted signal of the signal ② at the up-edge of the inverted signal of the signal 1 to store it as Q output and is reset when the Q output of D-FF 68 has become L-level, so that d.GENB will continue to remain at L-level as shown in FIG. 12(*m*).

Further, the phase comparison period signal generation circuit 52 outputs the OR signal based on d.GENB and signal ① as GENB.

(vii) In the phase comparator 20 in FIG. 10, the first, second and third D-FF's 81, 82 and 83 respectively receive the inputs of the levels of the data terminals at the up-edges of REF, VAR and VARB to store them as Q1, Q2 and Q3 outputs and are reset when the Q1 output has become L-level, while the Q2 output has become H-level to return to their initial states after the lapse of the delay period (Td+Td2) of the first and the second delayers 93 and 96.

Further, the fourth D-FF 97 receives the input of the H-level voltage to its data terminal at the up-edge of the Q3 output through the OR gate to store it as Q4 output and is reset to return to its initial state after the lapse of the delayed time Td1 from the point t2 at which the Q1 output has become 1-level, and the Q2 output has become H-level.

The fist and the second 3-state buffers 85 and 86 become active while the Q4 output of the fourth D-FF 97 is at H-level and inactive while at L-level; during the active state, the output becomes H-level or L-level according to the levels, H-level or L-level, of the Q1 and Q2 outputs; since the output becomes Hi-z during inactive state, Ph1 and Ph2 outputted from the first and the second 3-state buffers 85 and 86 become as shown in FIGS. 12(*o*) and (*p*). In other words, the starting point from which the gate control signal (Q4 output) becomes H-level is advanced by about 1 CKL from the conventional t2 point to prevent the omission of the first transition, and ending point is delayed by the delay time Td1 to prevent the omission of the last transition. In consequence, erroneous operations of the first and the second 3-state buffers 85 and 86 can be prevented.

(viii) The complete integral loop filter 21 outputs the control voltage corresponding to the phase difference between the REF and VAR according to the Ph1 and PH2 outputted from the phase comparator 20. That is, when there is no phase difference as in the case shown in FIGS. 12(*c*) and (*d*), both the Ph1 and Ph2 will not become either H-level or L-level as shown in (*o*) and (*p*) in the same figure, so that the control voltage Eco for maintaining the oscillation frequency is kept outputted to the VCO 14 for holding state.

In this embodiment, the loop filter is composed of the complete integral loop filter 21; the complete integral loop filter 21 is provided with an operational amplifier 30, which receives the Ph1 and Ph2 as input signals to its one terminal and the divide voltages of the H-level reference voltage Hr and the L-level reference voltage Lr as input signals to its other terminal; when both the Ph1 and Ph2 at H-level or L-level, the control voltage for decreasing or increasing the oscillation frequency is outputted to the VCO 14; when either one of the Ph1 or Ph2 is at H-level while the other is at L-level, or when both have high impedance, the control voltage for maintaining the oscillation frequency is outputted to the VCO 14, so that the voltage levels for the plus operation and minus operation ranging from an intermediate voltage are completely balanced to equalize the pull-in response from the delayed phase and the pull-in response from the advanced phase.

C: Next, the effect of the omission of the horizontal synchronizing signal HDX (i.e., the omission of the REF) will be explained referring to FIGS. 9, 10 and 13.

(i) For convenience of explanation, it is assumed that the omission of the REF whose phase is synchronized with that of the VAR has occurred as indicated with 2-dot-dash line in Q terminal of the D-FF 62 is a signal obtained by inverting and delaying the HWIN by 2 FCLK as shown FIG. 13(b), if it is assumed to have changed to H-level at the point t1, its level will change to L-level at the point t3 after about 17 CLK.

(ii) In the omission compensation circuit 24 in FIG. 9, the D-FF 64 is reset according to the Q output from the D-FF 61, and the clock terminal of the D-FF 63 will not become H-level due to the omission of the REF, so that the level of the signal ② outputted from the Q terminal of the D-FF 64 becomes L-level at the point preceding the point t1 by 1 FCLK and continue to remain at this level.

(iii) D-FF 53 receives the H-level voltage at the rise of the VAR to store it as Q output; D-FF 54 receives the Q output of the D-FF 53 to output it to the U/D terminal of the up-down counter, so that the up-down counter 55 enters enabling state immediately after the point t2 at which VAR rises as shown in FIG. 13(g) and starts counting from the next FLCK to continue up-counting until the level of the signal ① changes to L-level.

(iv) When the level of the signal ① has changed to L-level at the point t3, the up-down counter 55, similarly to the case shown in above B (iv), enters the down-counting mode to cause the counted value Qc to change similarly to the case shown in FIG. 13(g) and stops by itself when its level has changed to L-level following that the counted value Qc has become 000h (indicated as 0 in the figure).

(v) Similarly to the case of the B (v) mentioned previously, the decoder 71 outputs the signal ③ as is shown in FIG. 13(h), while the D-FF 65 outputs the signal ④ as is shown in (i) of the same figure.

Further, the selector 72 selects the signals ④ or ③ depending on the level (H or L) of the selected signal ⑤ to output the selected signal as Y-signal.

(vi) The output side of the NAND gate 74 becomes L-level only when the signal, obtained by delaying the HWIN by 1 FCLK, the signal ① and inverted signal of the signal 2 are at H-level respectively and becomes H-level under other conditions, so that d.REFX occurs at the point t3 as shown in FIG. 13(k). The level of the d. REFX changes to L-level at the point t3 and returns to H-level after the lapse of 1 FCLK from the point t3.

Further, the output side of the NAND gate 73 becomes L-level only when the Y-signal is at H-level (when the signal ④ is outputted) and the inverted signals of the signals ① and ② at H-level, remaining at H-level under other conditions, so that d.VARX appears at the point t4 as shown in FIG. 13(l). The level of d.VARX changes to L-level at the point t4 after the lapse of 1 FCLK from the appearance of the signal ④ at the point where the signal ① is at L-level and returns to H-level after the lapse of 1 FCLK from the point t4.

Further, the D-FF 69 receives the inverted signal of the signal ② at the up-edge of the inverted signal of the signal ① to store it as Q output and is reset when the Q output of the D-FF 68 has become L-level, so that, as shown in FIG. 13(m), the level of the d.GENB changes to H-level and returns to L-level at the point t5 after the lapse of 1 FCLK from the point t4. That is, the output enabling period is extended by the period from t3 to t5 compared with the period in the case of B where there is no omission (case of FIG. 8).

(vii) In the phase comparator 20 shown in FIG. 10, the first and the second D-FF's 81 and 82 are rest and set respectively when d.REFX and d.VARX are generated respectively (at L-level) to return to their initial states respectively.

Further, the fourth D-FF 97 receives the H-level voltage to its data terminal at the up-edge of the Q3 output through the OR gate 91 to store it as Q4 output and is reset after the lapse of Td1 from t4 to returns to its initial state. That is, the fourth D-FF 97 is reset to return to its initial state when the Q1 output of the first D-FF 81 is at L-level and after the lapse of Td1 from t4 at which the Q2 output of the second D-FF 82 has changed to H-level according to the generation of the d.VARX.

Similarly to the case of B (vii) described previously, the Ph1 and Ph2 outputted from the first and the second 3-state buffers 85 and 86 vary as shown in FIGS. 13(o) and (p) respectively. That is, during the period Ta from t2 to t3, both the Ph1 and Ph2 are at H-level, while both the Ph1 and Ph2 become L-level during the period Th from t3 to t4.

Further, similarly to the case of B discussed previously, not only the starting point from which the gate control signal (Q4 output) becomes H-level can be advanced by about 1 CKL from t2 used in the conventional case but also the end point can be delayed by Td1 to prevent the erroneous operation.

(viii) The complete integral loop filter 21 outputs the control voltage corresponding to the phase difference between REF and VAR according to the Ph1 and Ph2 outputted from the phase comparator 20. That is, as shown in FIGS. 13(o) and (p), during the period Ta through which both the Ph1 and Ph2 are at H-level, the control voltage Ec for decreasing the oscillation frequency is outputted to VCO 14, while, during the period Th in which both the Ph1 and Ph2 are at L-level, the control voltage for increasing the oscillation frequency is outputted to the VCO 14.

The periods Ta and Tb are dependent on the counted value Qc of the up-down counter 55, and the up-down counter 55 does not count the unstable CLK from the VCO 14, which is in unstable condition while there is the omission but counts the stable FCLK outputted from the clock generation circuit 25, so that the period Ta and the period Th can be made substantially identical. Therefore, the decrease in the control voltage added, according to d.REFX, to correct the omission of HDX is offset by the increase in the control voltage Ec added according to d.VARX, so that the compensation for the omission of the HDX can be made properly, and the stable CLK can be supplied from the output side of the VCO 14 even when the VCO 14 has a very wide variable range of frequency.

Further, in the complete integral loop filter 21, the voltage levels for the plus operation and the minus operation ranging from the intermediate voltage are completely balanced to equalize the pull-in response from phase delay and the pull-in response from the phase advance similarly to case of B discussed previously.

D: Next, the effect of the successive omission of the horizontal synchronizing signal HDX (i.e., successive omission of REF) will be explained referring to FIGS. 9, 10, 13 and 14.

In general, the phase of the VAR (the phase of VAR is synchronized with that of the CLK) will not coincide with that of the FCLK, and so, for convenience of explanation, it is assumed that the phase difference between the VAR and the FCLK is (time period not longer than 1 FCLK) as shown in FIG. 14(c).

In the case discussed in (viii) previously, as shown in FIGS. 13(o) and (p), it is explained that the period Ta, through which both the Ph1 and Ph2 are at H-level, is substantially equal to the period Tb, during which the both are at L-level, but, when the phase of the VAR and that of the FCLK do not coincide with each other, this results in that Ta<>Tb. More particularly, in the omission compensation circuit 24, when it is designed that the selector 27 is not provided, and the signal ④ is inputted to the NAND gate 73, the period Tb becomes the period for 9 FCLK (hereinafter referred to as Tb (9)) as shown in FIGS. 13(g) and (m), while, when it is designed so that the signal ③ is inputted to the NAND gate, the period Tb becomes equivalent to 8 FCLK (hereinafter referred to as Tb (8)). On the other hand, since the period Ta is equivalent to the period for 8 FCLK plus a, it follows that Tb (8)<Ta<Tb (9).

(i) For convenience of explanation, if it is assumed that the HDX is omitted n times (e.g., n=4) successively, and the periods of H-level of the signal ① corresponding to the HWIN at the time of n times of successive omission of the HDX are t1–t14, t6–t9 and t11–t14 as shown in FIG. 14(b), and that the signal ⑤, which is Q output of the D-FF 66 in the omission compensation circuit 24 shown in FIG. 9, is at H-level at t1, the level of the signal ⑤ varies to L-level at t6, to H-level at t11 . . . (i.e., the signal level varies at each rise of the signal ①).

Figure 14:
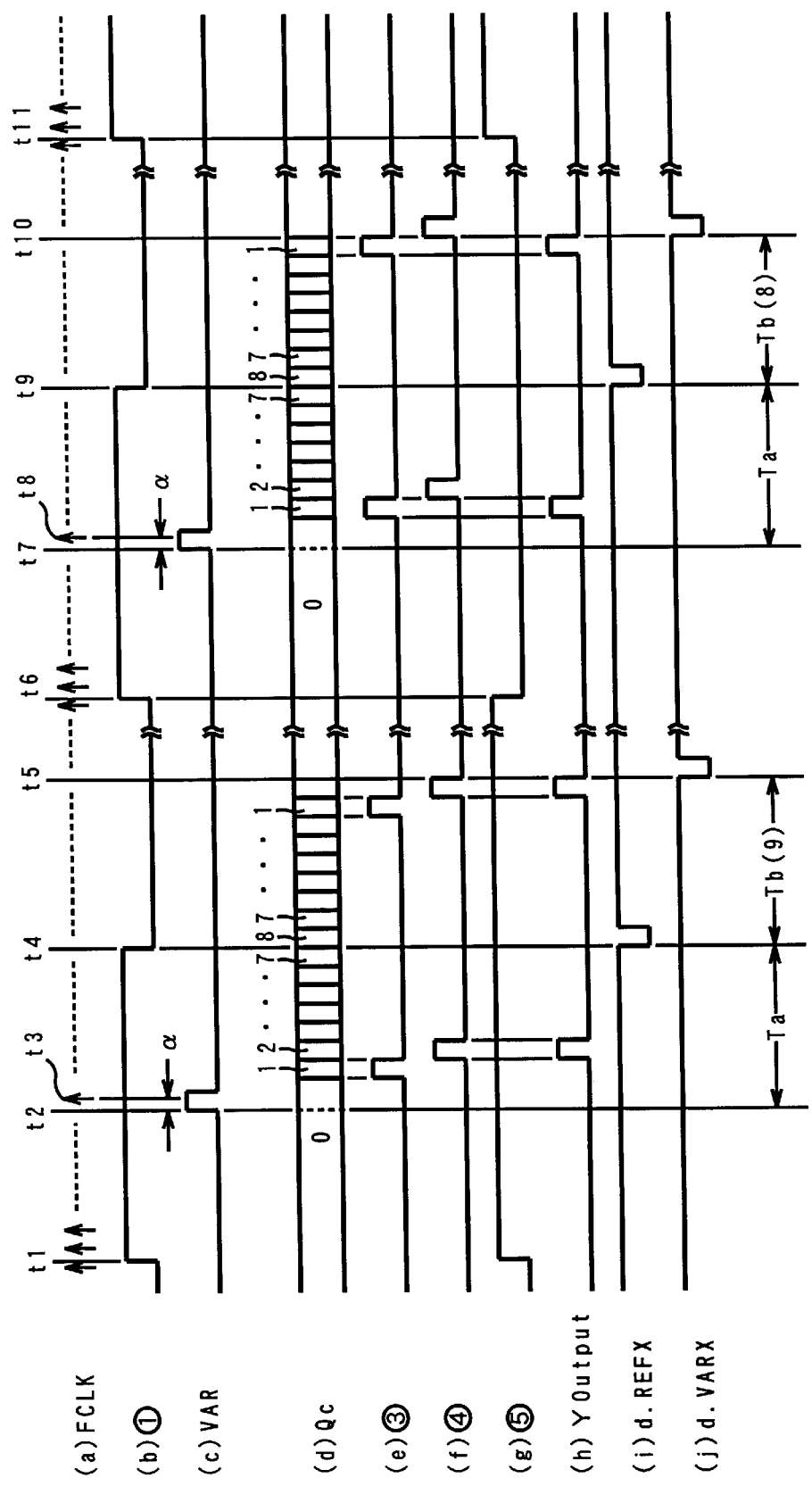
FIG. 14 is a timing chart for explaining the function of the present invention in the case where the omission of the reference signal has occurred successively (i.e., Omission of the HDX has occurred successively).

(ii) The selector 72 selectively outputs the signal ④ or ③ depending on whether the level of the signal ⑤ is H-level or L-level, and so, as shown in FIG. 14 (h), the Y-output of the selector 72 becomes signal ④ in the first omission period, signal ③ in the next omission period and signal ④ in the following omission period (not shown).

(iii) Similarly to the case of C (iv) described previously, the d.REFX appears at t4 and t9, . . . at which the signal ① falls, while the d.VARX appears at the fall of the Y-output, and so Ta<Tb (9) in the initial omission period, and Ta>Tb (8) in the next omission period, that is, the Ta and Tb become greater than the other alternately in each of successive omission periods. Therefore, even when the HDX is absent successively, the difference between the accumulation period of Ta and that of Tb can be reduced (e.g., within a half of FCLK).

(iv) On the other hand, as explained in the case of C (vii), the period Ta corresponds to the phase difference between VAR and d.REFX (phase difference by advance) and to the period in which both the Ph1 and Ph2 outputted from the first and the second 3-state buffers 85 and 86 become H-level, while the period Tb corresponds to the phase difference between the d.REFX and d.VARX (phase difference by delay) and to the period in which both the Ph1 and Ph2 outputted from the first and the second 3-state buffers 85 and 86 become L-level.

Therefore, the control voltage Ec outputted to the VCO 14 from the complete integral loop filter 21 serves as the control voltage for decreasing the oscillation frequency in the period Ta, while serving as the control voltage for increasing the oscillation frequency in the period Tb; since the accumulation period of Ta and that of Tb are substantially equal, even if the omission of the HDX has occurred successively, the decrease in the control voltage Ec, which has been added by the d.REFX in order to compensate the omission of the HDX, is offset by the increase in the control voltage Ec, which has been added by the d.VARX. Therefore, even when the omission of the HDX has occurred successively, the omission can be compensated properly, so that the stable CLK can be supplied from the output side of the VCO 14 even if the VCO 14 has a very wide frequency variation range. In consequence, with this system, the efficiency of the digital processing of the image can be improved.

The first embodiment described in the foregoing is concerned with a case where, in order to prevent the correction error from accumulating when the omission of the HDX occurs successively, the omission period meter is provided with the up-down counter designed for counting the clock outputted from the clock generation circuit, and the correction signal generator is provided with the decoder, 1 clock delayer and the selector, but the present invention is not limited to this case, since the present invention is also applicable to the case where a limit is set to the number of the successive omission so that the phase comparison is stopped completely when such limit is exceeded.

In the case of the above first embodiment, in order to maintain a satisfactory linearity between the phase difference and the control voltage even when the phase difference between the reference signal and comparison signal is near 0, the gate counter is designed to output the control signal (VARB) too, but the present invention is not limited to this case, since the present invention is also applicable to the case where, similarly to the case of the prior art, the loop counter is designed to be capable of dividing the frequency of the clock outputted from the VCO into 1/N for feeding it back, as a comparison signal, to the phase comparator, and where the output of the gate control signal is omitted.

In the case of the first embodiment, in order to completely balance the levels of the voltages for the plus operation and the minus operation ranging from the intermediate voltage in the operational amplifier and to equalize the pull-in response due to phase delay and the pull-in response due to phase advance, the loop filter is composed of a complete integral loop filter provided with the operational amplifier, but the present invention is not limited to this case, since the present invention is also applicable to the case where the control voltage can be outputted to the VCO according to the signal outputted from the phase comparator.

In the above case of the first embodiment, in order to prevent the erroneous operation of the first and the second 3-state buffers, the control circuit of the phase comparator is provided with the second delayer for delaying the output signal of the first delayer by a set time period Td2 for output to the reset terminals of the first, second and third D-FF's, but the present invention is not limited to this case, since the present invention is also applicable to the case where the second delayer is omitted, and the signal from the first delayer is directly outputted to the reset terminals of the first, second and third D-FF's.

In the first embodiment discussed above, the explanation is made as to the case where, in order to prevent the omission of the last transition of the phase information to be supplied to the 3-state buffer, the control circuit comprises the inverter, OR gate, AND gate, the fourth D-FF and delayer, but the present invention is not limited to this case, since the present invention is also applicable to the case where the control circuit is designed not only for controlling the first and the second 3-state buffers in active state according to the OR signal based on the inverted signal of the Q output of the first D-FF and the Q output of the third D-FF but also for controlling the first and the second 3-state buffers in inactive state according to the AND signal based on the Q output of the first 3-state buffer and the Q output of the second 3-state buffer.

In the first embodiment discussed above, the explanation is made as to case where, in order to simplify the compositions of the omission compensation circuit and the phase comparator, the omission compensation circuit is composed of the omission period meter and correction signal generator as main components, while the phase comparator is composed mainly of the first, second and third D-FF's, the fist and second 3-state buffers and the control circuit, but the present invention is not limited to this case, since the present invention is also applicable to the case where the omission compensation circuit is designed to detect the omission of the reference signal to output the first correction signal for correcting the omission and the second correction signal for offsetting the phase difference between the comparison signal and the first correction signal, while the phase comparator compares the reference signal and the comparison signal to output the signal corresponding to the phase difference and outputs the signal corresponding to the phase difference between the first correction signal and the second correction signal.

Figure 15:
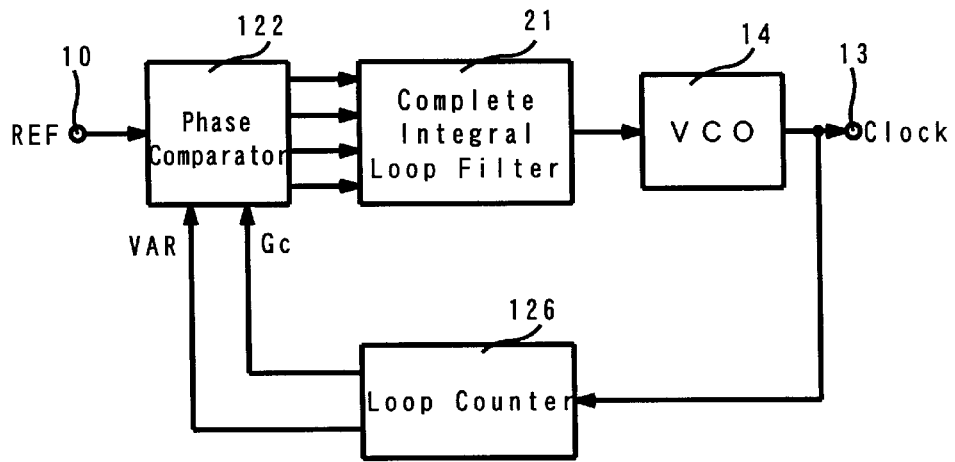
FIG. 15 is a block diagram showing the PLL as the second embodiment of the present invention.

FIG. 15 shows the PLL as the second embodiment of the present invention, wherein the common parts to those in FIG. 1 are assigned common numerals and symbols.

In FIG. 15, 122 represents the phase comparator, which not only outputs the first and the second phase difference signals Ph1 and ph2 according to the reference signal REF (e.g., horizontal synchronizing signal), the comparison signal VAR, which will be described later, and the gate control signal Gc but also outputs the H-level reference signal Hr, and the L-level reference signal Lr. The numeral 21 represents the complete integral loop filter, which outputs the control voltage according to the phase difference based on the first and the second phase difference signals Ph1, Ph2, H-level reference signal Hr and L-level reference signal Lr. The numeral 14 represents the VCO, which outputs to the output terminal 13 the clock having a 25 frequency corresponding to the control voltage outputted from the complete integral loop filter 21. The numeral 126 is a loop counter, which not only divides the frequency of the clock outputted from the VCO 14 into 1/N to feed it back to the phase comparator 122 but also generates the gate control signal Gc, obtained by advancing the clock outputted from the VCO 14 by pulse width, for output to the phase comparator 122.

Figure 16:
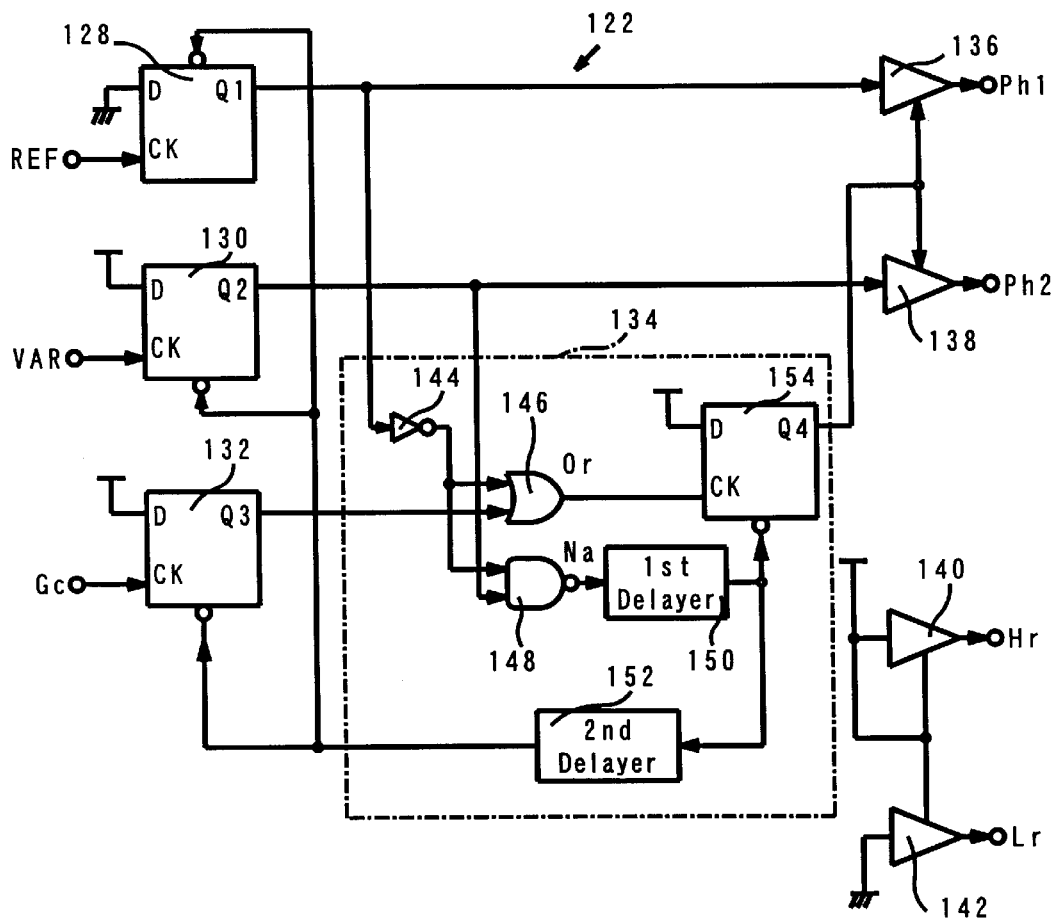
FIG. 16 is a block diagram showing the phase comparator 122 shown in FIG. 15.

The phase comparator 122 comprises, as shown in FIG. 16, the first, second and third D-FF's 128, 130, 132, the control circuit 134, and the first, second, third and fourth 3-state buffers 136, 138, 140 and 142.

The first D-FF 128 receives the L-level voltage (e.g., grounding voltage) inputted to its data terminal at the up-edge (rise) of reference signal REF inputted to its clock terminal to store it as Q1 output. The second D-FF 130 receives the input of the H-level voltage (e.g., the voltage applied from Vcc power source through the pull-up resistor) inputted to its data terminal at the up-edge of the comparison signal VAR inputted to its clock terminal to store it as Q2 output. The third D-FF 132 receives the H-level voltage inputted to its data terminal at the up-edge of the gate control signal inputted to its clock terminal to store it as Q3 output.

The control circuit 134 comprises an inverter 144 for inverting the Q1 output of the first D-FF 128 for output, an OR gate 146 for outputting the OR signal based on the output of the inverter 144 and the Q3 output, an NAND gate 148 for outputting the signal Na, obtained by inverting the AND signal based on the output of the inverter 144 and the Q2 output, a first delayer 150 for outputting the Na signal delayed by the time period t1, a second delayer 152 for outputting the output of the first delayer delayed by the time period t2 and the fourth D-FF 154 for receiving the H-level voltage inputted to its data terminal at the up-edge of the signal Or outputted from the OR gate 146 to store it as Q4 output.

The fist and the second 3-state buffers 136 and 138 respectively receive the Q1 output and Q2 output of the first and the second D-FF's 128 and 130 as input signals and the Q4 signal of the fourth D-FF 154 as the gate control signal to output the first and the second phase difference signals Ph1 and Ph2 in 3 states, i.e., H-level state, L-level state and Hi-z state. More particularly, when the gate signal is at H-level, the first and the second phase difference signals Ph1 and Ph2 becomes H-level according to the H-level of the input signal, while when the gate control signal is at L-level, the first and the second phase difference signals Ph1 and Ph2 become Hi-z.

The input side of the third 3-state buffer 140 is supplied with the H-level voltage; the input side of the fourth 3-state buffer is grounded; the gates of the third and the fourth 3-state buffers 140 and 142 are supplied with the H-level voltage; the H-level reference voltage Hr and L-level reference voltage Lr are outputted from the output sides of the third and the fourth 3-state buffers 140 and 142.

The loop counter 126 comprises, as shown in FIG. 17, a counter 158 for counting the clock outputted from the VCO 14, a first coincidence circuit 160 for outputting the comparison signal VAR, obtained by dividing the clock frequency into 1/N, to the reset terminal of the counter 158 when the counted value of the counter 158 coincides with a set value N and a second coincidence circuit 162 for outputting the gate control signal Gc, obtained by dividing the clock signal into 1/N, (i.e., signal obtained by advancing the phase of the comparison signal VAR by 1 clock) when the counted value of the counter 158 coincides with the set value (N−1).

Next, the functions illustrated in FIG. 15 through FIG. 17 will be explained referring to FIG. 18 through FIG. 20.

A: First, the explanation will be made as to the function in the case where the phase difference between the reference signal REF and comparison signal VAR is relatively large.

(i) As shown in FIGS. 18(a) and (b), assuming that the phase of the comparison signal VAR is ahead of the reference signal REF by about 4 clocks, the gate control signal Gc outputted from the loop counter 126 to the phase comparator 122 becomes a signal obtained by advancing the phase of the comparison signal VAR by 1 clock as shown in FIG. 18(c).

(ii) The first, second and third D-FF's 128, 130 and 132 of the phase comparator 122 respectively receive the inputs of the voltage levels to their respective data terminals at the up-edge of the signals REF, VAR and Gc, shown in FIGS. 18(a), (b) and (c), to store them as Q1 output, Q2 output and Q3 output; the first D-FF 128 is set after the lapse of the delay period of time (t1+t2) starting from the time when the Q1 output has become L-level and the Q2 output has become H-level, and the first, second and third D-FF's 128, 130 and 132 are reset to return to their initial states, so that the Q1, Q2 and Q3 outputs outputted from the first, second and third D-FF's 128, 130 and 132 become as shown in FIGS. 18(d), (e) and (f).

Figure 18:
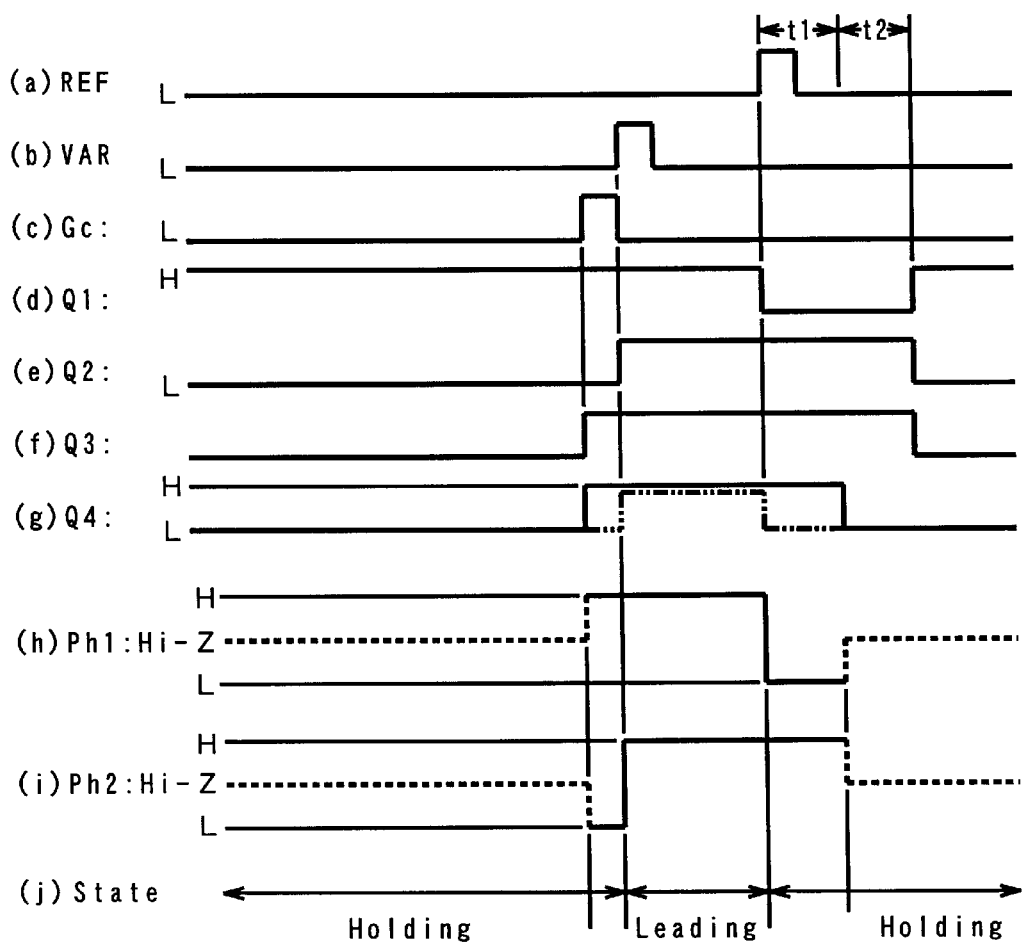
FIG. 18 is a timing chart for explaining the function of (the loop counter 126) when the phase difference between the reference signal REF and the comparison signal VAR is relatively large.

(iii) The fourth D-FF 154 receives the input of the H-level voltage to its data terminal at the up-edge of the Q3 output through the OR gate 146 to store it as Q4 output and is reset to return to its initial state after the lapse of the time period t1 starting from the time when the Q2 output has become H-level, so that the Q4 output of the fourth D-FF 154 becomes as shown in FIG. 18(*g*). That is, the point at which the gate control signal (Q4 output) becomes H-level can be advanced by about 1 clock compared with the conventional case, which is indicated with 2-dot-dash line, and the end point can be delayed by the time period t1.

(iv) The first and the second 3-state buffers 136 and 138 are in active state while the Q4 output of the fourth D-FF 154 is at H-level and in inactive state at L-level, become H-level or L-level depending on whether the Q1 output and the Q2 output are at H-level or L-level during the active state and become Hi-z during inactive state, so that, as shown in FIGS. 18(*h*) and (*i*), the first phase difference signal Ph1 outputted from the first 3-state buffer 36 varies within the range of Hi-z, H-level, L-level and Hi-z, while the second phase difference signal Ph2 varies within the range of Hi-z, L-level, H-level and Hi-z.

(v) The complete integral loop filter 21 outputs the control voltage corresponding to the phase difference between the reference signal REF and the comparison signal VAR according to the first and the second phase difference signals from the phase comparator 122. That is, as shown in FIG. 18(*j*), when the signals Ph1 and Ph2 are at Hi-z or when one is at H-level while the other is at L-level, the control signal is outputted to the VCO 14 (for hold state) in order to maintain the oscillation frequency, while, when both the Ph1 and Ph2 are at H-level (advanced phase state), the control signal for decreasing the oscillation frequency is outputted to the VCO 14.

In this case, the voltage applied to the + input side of the operational amplifier in the complete integral loop filter is the divided voltages of the reference voltages Hr and Lr supplied from the phase comparator 122 correspond to H-level and L-level of the signals Ph1 and Ph2, so that the voltage levels of plus operation and the minus operation ranging from the intermediate voltage in the operational amplifier 30 can be balanced completely, and the pull-in response from the delayed phase and the pull-in response from the advanced phase can be equalized.

(vi) Further, contrary to the case of (i), when the phase of the comparison signal VAR is delayed by several clocks compared with that of the reference signal REF, similarly to the cases of (i) through (v), the complete integral loop filter 21 outputs the control signal to the VCO 14 (for hold state) in order to maintain the oscillation frequency when the first and the second phase difference signals Ph1 and Ph2 are at Hi-z or when one is at H-level while the other is at L-level, and also outputs the control signal to the VCO 14 in order to increase the oscillation frequency when both the Ph1 and Ph2 are at L-level (delayed phase state).

(vii) Therefore, even when there occurs the time lag for the input between the phase information (Q1 output and Q2 output) to be inputted to the first and the second 3-state buffers 136 and 138 and the gate control signal (Q4 output) due to the delay in the transmission of the signal or the like, the omission of the first transition and the last transition of the information to be inputted to the first and the second 3-state buffers 136 and 138 can be prevented to output the control voltage corresponding to the phase difference to the VCO 14.

Further, as explained in (ii) and (iii), the Q4 output is set to L-level, and the first and the second 3-state buffers 136 and 138 are set to inactive state before setting the first D-FF 128 after the lapse of the time period t2, so that the erroneous operations of the first and the second 3-state buffers 136 and 138 can be prevented.

B: Next, the function in the case where the phase difference between the reference signal REF and the comparison signal VAR is near 0 will be explained referring to FIG. 19.

Figure 19:
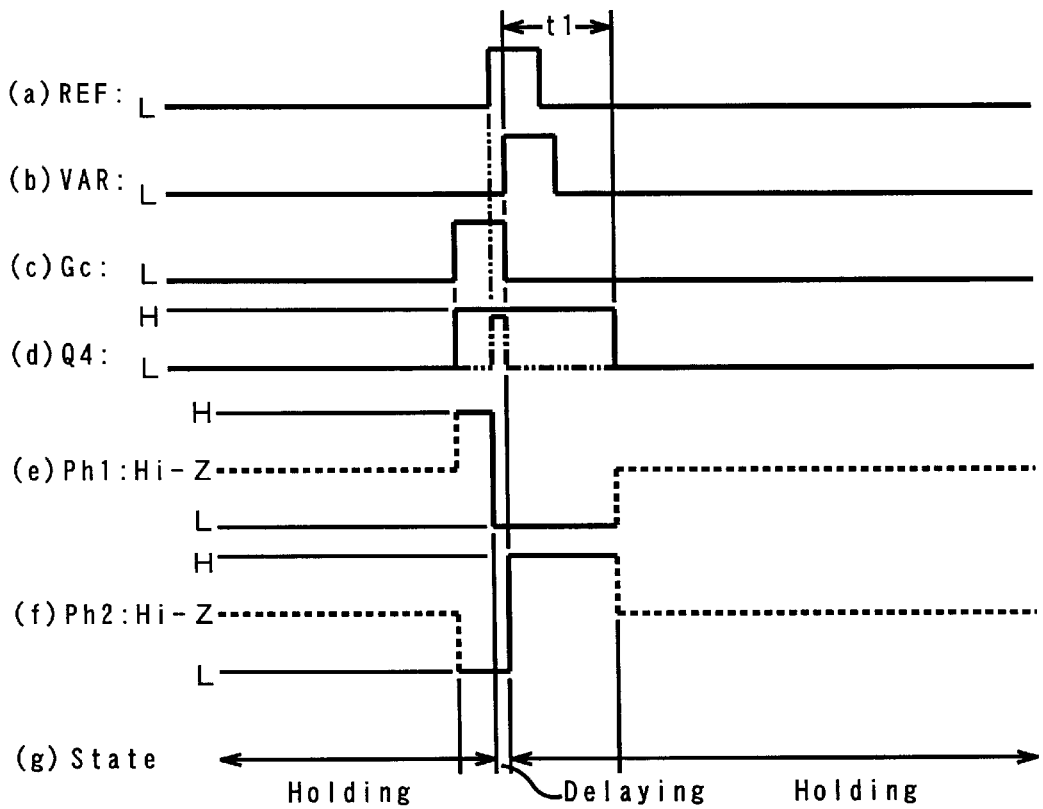
FIG. 19 is a timing chart for explaining the functions (of the circuits) in FIG. 15 and FIG. 16, where the phase difference between the reference signal REF and comparison signal VAR is relatively small (near 0).
Figure 20:
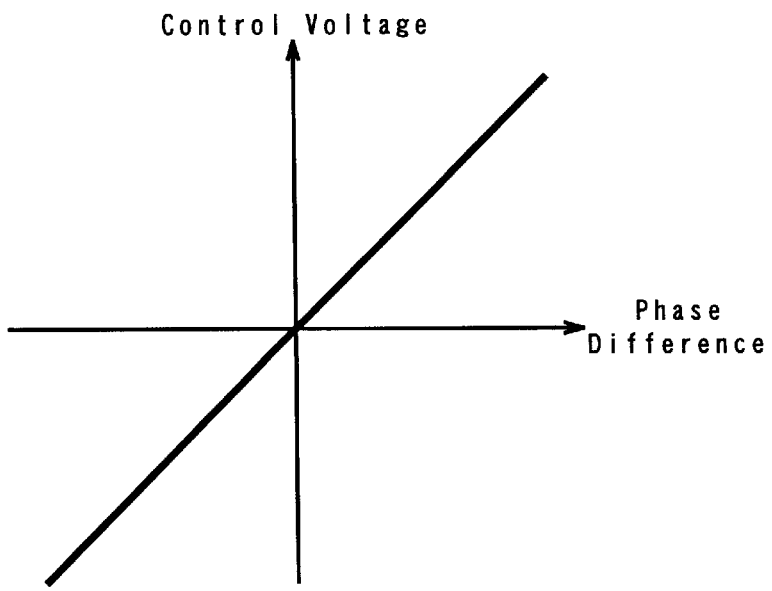
FIG. 20 is a characteristic diagram showing the relationship among the phase difference between the reference signal REF and the comparison signal VAR and the control voltage applied to VCO 14 from the complete integral loop filter 21.

(i) As shown in FIGS. 19(*a*) and (*b*), assume that the phase of the comparison signal is slightly delayed from that of the reference signal VAR. The gate control signal Gc outputted to the phase comparator 122 from the loop counter 126 is the signal obtained by advancing the phase of the reference signal VAR by 1 clock as shown in (c) of the same figure.

(ii) The fourth D-FF 154 receives the H-level voltage to its data terminal at the up-edge of the Q3 output through the OR gate 146 to store it as Q4 output and is reset to return to its initial state after the lapse of the time period t1 from the time when the Q1 output has become L-level, while the Q2 output has become H-level, so that the Q4 output to the DFF 154 as shown in FIG. 19(*d*). That is, not only the point at which the gate control signal (Q4 output) starts to become H-level can be advanced by about 1 clock than that in the conventional case indicated with 2-dot-dash line but also the end point can be delayed by the time period t1.

(iii) The first and the second 3-state buffers 136 and 138 become active or inactive depending on whether the Q4 output of the fourth D-FF 154 at H-level; as shown in FIG. 19(*e*) and (*f*), the first phase difference signal Ph1 outputted from the first 3-state buffer 136 varies within the range of Hi-z, H-level, L-level and Hi-z, while the second phase difference Ph2 outputted from the second 3-state buffer 138 varies within the range of Hi-z, L-level, H-level and Hi-z.

(iv) The complete integral loop filter 21 outputs the control voltage corresponding to the phase difference signal between the reference signal REF and the comparison signal VAR according to the first and the second phase difference signals Ph1 and Ph2 from the phase comparator 122. That is, as shown in FIG. 19(*a*), when both the signals Ph1 and Ph2 are at Hi-z, or when one is at H-level while the other is at L-level, the control signal for maintaining the oscillation frequency is outputted to the VCO 14 (for hold state), and, when both the signals Ph1 and Ph2 are at L-level (delayed phase state), the control signal for increasing the oscillation frequency is outputted to the VC 14.

In this case, the voltage applied to the + input side of the operational amplifier 30 in the complete integral loop filter 21 is the divided voltage of the reference voltages Hr (or) Lr, supplied from the phase comparator 122, and since the reference voltages Hr and Lr respectively correspond to the H-level and L-level of the signals Ph1 and Ph2, the voltage levels of the plus operation and the minus operation ranging from the intermediate voltage (intermediate voltage between reference voltages Hr and Lr) can be balanced completely, and the pull-in response from the phase delay and the pull-in response from the phase advance can be equalized.

(v) Further, contrary to the case of (i), when the phase of the comparison signal VAR is advanced slightly to the reference signal REF, similarly to the cases explained in (i) through (iv), when both the first and the second phase difference signals Ph1 and Ph2 are at Hi-z, or when one is at H-level while the other is at L-level, the complete integral loop filter 21 outputs the control signal for maintaining the oscillation frequency to the VCO 14 (for hold state) and outputs the control signal for decreasing the oscillation frequency to the VCO 14 when both the signals Ph1 and Ph2 are at H-level (advanced phase state).

(vi) Therefore, even if there occurs the difference in the timing between the input of the phase information (Q1 output and Q2 output) to the first and the second 3-state buffers and the input of the gate control signal (Q4 output) due to the delay in the transmission of the signal or the like, the omission of the first transition and the last transition of the phase information to be inputted to the first and the second 3-state buffers 136 and 138 can be prevented so that the control voltage corresponding to the phase difference can be outputted to the VCO 14.

Further, similarly to the case of A mentioned previously, the Q4 output is set to L-level to set the first and the second 3-state buffers 136 and 138 inactive before setting the first D-FF 128 after the lapse of the time period t2, and the second and the third D-FF's 130 and 132 are reset, so that the erroneous operations of the first and the second 3-state buffers 136 and 138 can be prevented.

C: As is obvious from the previously mentioned cases of A and B, not only even when the phase difference between the reference signal and the comparison signal is relatively large but also even when the phase difference is near 0 and even when there has occurred the difference in the timing between the input of the phase information (Q1 and Q2 outputs) and the input of the gate control signal (Q4 output), the omission of the first transition and the last transition the phase information to be inputted to the first and the second 3-state buffers 136 and 138 can be prevented to output the control voltage corresponding to the phase difference to the VCO 14, so that, as shown in FIG. 7, a good linearity can be established as to the characteristics of the phase difference and the control voltage, and the stable clock can be supplied even when the VCO 14 having a very wide frequency variation range is used, thereby contributing to the improvement in the performance of the digital image processing.

In the above-mentioned case of the second embodiment, in order to simplify the loop counter and the composition of its circuit, the loop counter is made to comprise the counter, the first and the second coincidence circuits, and the gate control signal generation circuit is incorporated into the loop counter, but the present invention is not limited to this case, since the present invention is applicable to the case where the loop counter is designed, similarly to the case of the prior art, for dividing the clock frequency outputted from the VCO into 1/N to feed back it as a comparison signal to the phase comparator and for providing the gate control signal generation circuit separately.

In the above-mentioned case of the second embodiment, the loop filter is made to comprise the complete integral loop filter provided with the operational amplifier in order not only to completely balance the voltage levels for the plus operation and the minus operation ranging from the intermediate voltage in the operational amplifier but also to equalize the pull-in response from the phase delay and the pull-in response from the phase advance, but the present invention is not limited to this case, since the present invention is also applicable to the case where the control voltage corresponding to the signal (e.g., the first and the second phase difference signals (3-state signal)) outputted from the phase comparator is output to the VCO.

In the above-mentioned case of the second embodiment, the explanation is as to the case where in order to prevent the erroneous operations of the first and second 3-state buffers, the control circuit is made to comprise the second delayer designed for delaying the output signal of the first delayer by the set time t2 for output to the set terminal of the first D-FF and to the reset terminals of the second and the third D-FF's, but the present invention is not limited to this case, since the present invention is also applicable to the case where the second delayer is omitted for making the output directly not only to the set terminal of the first D-FF but also to the reset terminals of the second and the third D-FF's.

In the above-mentioned the second embodiment, the explanation is made as to the case where in order to prevent the omission of the last transition of the phase information to be supplied to the 3-state buffer, the control circuit is made to comprise the inverter, OR gate, fourth D-FF, NAND gate and first delayer, but the present invention is not limited to this case, since the present invention is also applicable to the case where the control circuit is designed so that not only the first and the second 3-state buffers in active state can be controlled according to the OR signal based on the signal obtained by inverting the Q output of the first D-FF and the Q output of the third D-FF but also the first and the second 3-state buffers in inactive state can be controlled according to the inverted signal of the AND signal based on the inverted signal of the Q output of the first F-DD and the Q output of the second D-FF.

In the above-mentioned the second embodiment, the explanation is made as to the case where in order to simplify the composition of the phase comparator, the phase comparator is made to comprise the first, second and third D-FF's, the first and second 3-state buffers and the control circuit, but the present invention is not limited to this case, since the present invention is also applicable to the case where the phase comparator, for outputting the signal according to the phase difference signal by comparing the reference signal and the comparison signal, is designed not only for outputting the signals of 3 different states according to the phase difference between the reference signal and the comparison signal but also provided with the 3-state buffer which can be controlled in active state according to the gate control signal.

INDUSTRIAL APPLICABILITY

As described in the foregoing, the present invention is applicable to the PLL for generating the clock (e.g., system clock) to be used for the digital processing of the TV signal, VTR signal and the like. The present invention is also suited for the PLL comprising a VOC having a very wide frequency variation range. For instance, the PLL according to the present invention is not only capable of properly compensating for the omission of the reference signal if any but also capable of letting the phase comparator output accurate phase difference signal corresponding to the phase difference to the VOC side to generate stable clock.

What is claimed is:

1. A phase-locked loop comprising a phase comparator for comparing a reference signal and a comparison signal to output a signal corresponding to a phase difference, a loop filter for outputting a control voltage corresponding to the signal outputted from the loop filter, a voltage controlled oscillator for outputting a clock corresponding to the control voltage outputted from the loop filter and a loop counter for dividing the frequency of the clock outputted from the voltage controlled oscillator into 1/N, N: an integer for feedback as a comparison signal to the phase comparator, wherein there are further provided a prediction window circuit for outputting a prediction window signal for predicting the point at which the reference signal is generated and an omission compensation circuit for not only detecting the omission of the reference signal at the time of the output of the prediction window signal but also outputting a first correction signal for correcting the omission and a second correction signal for offsetting the phase difference between the comparison signal and the first correction signal, whereby the phase comparator outputs not only a signal corresponding to the phase difference between the comparison signal and the first correction signal but also the signal corresponding to the phase difference between the first correction signal and the second correction signal.

2. The phase-locked loop according to claim 1, wherein the omission compensation circuit comprises mainly an omission period meter for measuring the omission period of the reference signal based on the prediction window signal and the comparison signal and a correction signal generator for outputting the first and the second correction signals based on the prediction window signal, the reference signal and the measured value of the omission period meter; the phase comparator comprises a first D-flip-flop for receiving the reference signal as an input to its clock terminal and an L-level voltage as an input to its data terminal, a second-flip-flop for receiving the comparison signal as an input to its clock terminal and a H-level voltage as an input to its data terminal, a first 3-state buffer for receiving the Q signal of the first F-flip-flop as an input for outputting the first phase difference signal, a second 3-state buffer for receiving the Q signal of the second D-flip-flop as an input for outputting a second phase difference signal and a control circuit for not only controlling the first and the second 3-state buffers in active state according to the inverted signal of the Q output of the first D-flip-flop but also controlling the first and the second 3-state buffers in inactive state according to the inverted signal of the AND signal based on the inverted signal of the Q output of the first D-flip-flop and the Q output of the second D-flip-flop; the first D-flip-flop is reset by the first correction signal, and the second D-flip-flop is set by the second correction signal.

3. The phase-locked loop according to the claim 2, wherein the omission period meter is provided with an up-down counter for not only counting the clocks outputted from the clock generation circuit but also for making up-counting according to the comparison signal and down-counting according to the prediction window signal.

4. The phase-locked loop according to the claim 3, wherein the correction signal generator comprises a decoder for decoding that the counted value of the up-down counter has reached a set value, a 1-clock delayer for delaying, for output, the output signal of the decoder by 1 clock of the clock outputted from the clock generation circuit and a selector for alternately selecting the output signal of the decoder and the output signal of the 1-clock delayer with each output of the prediction window signal, and the second correction signal is outputted according to the output signal of the selector, the prediction window signal and the reference signal.

5. The phase-locked loop according to claim 2, wherein the loop counter comprises a counter for receiving a first set value as an input to its data terminal, counting the clock outputted from the voltage controller for output and delaying by 1 clock the output from a ripple carry terminal to output it as a comparison signal and to input it to the load terminal, a coincidence circuit for outputting a coincidence signal when the counted value of the count coincides with the second set value and a delay circuit for delaying by 1 clock the output of the coincidence circuit for obtaining a gate control signal; the phase comparator is provided with the third D-flip-flop for receiving the gate control signal as an input to its clock terminal and the H-level voltage as an input to its data terminal; the control circuit controls the first and the second 3-state buffers in active state according to the OR signal based on the inverted signal of the Q output of the first D-flip-flop and the Q output of the third D-flip-flop.

6. The phase-locked loop according to claim 2, wherein the control circuit comprises an inverter for inverting the Q output of the first D-flip-flop, the fourth D-flip-flop for receiving the output signal of the inverter as an input to its clock terminal, the H-level voltage as an input to its data terminal and the Q output as the gate signal to the first and the second 3-state buffers, an NAND gate for inverting, for output, the AND signal based on the output signal of the inverter and the Q output of the second D-flip-flop and a first delayer for delaying by a set time period Td1 the output signal of the NAND gate for output to the reset terminal side of the fourth D-flip-flop.

7. The phase-locked loop according to claim 5, wherein the control circuit comprises an inverter for inverting the Q output of the first D-flip-flop, an OR gate for outputting the OR signal based on the output signal of the inverter and the Q output of a third D-flip-flop, a fourth D-flip-flip for receiving the output signal of the OR gate as an input to its clock terminal, the H-level voltage as an input to its data terminal and the Q output as the gate signal to the first and the second 3-state buffers, an NAND gate for inverting, for output, the AND signal based on the output signal of the inverter and the Q output of the second D-flip-flop and a first delayer for delaying by a set period of time Td1 the output signal of the NAND gate for output to the reset terminal side of the fourth D-flip-flop.

8. The phase-locked loop according to the claim 6, wherein the control circuit is provided with a second delayer for not only delaying the output signal from the first delayer by a set period of time Td2 for output to the reset terminal of the first D-flip-flop but also for output to the reset terminal of the second D-flip-flop through the AND gate, and the first correction signal is inputted to the other input side of the AND gate.

9. The phase-locked loop according to claim 7, wherein the control circuit is provided with a second delayer for delaying by a set time period Td2 the output signal of the first delayer for output to the set terminal of the first D-flip-flop and to the reset terminal of the second F-flip-flop, and the first correction signal is inputted to the other input side of the AND gate.

10. The phase-locked loop according to claim 2, wherein the loop filter is composed of a complete integral loop filter incorporating an operational amplifier so that the first and the second phase difference signals are input to one input side of the operational amplifier while the divided voltages of the H-level reference voltage and the L-level reference voltage are input to the other input side, and the control voltage is outputted to the voltage controlled oscillator from the output side of the operational amplifier; when both the first and the second phase difference signals are at H-level or L-level, the control signal for decreasing or increasing the oscillation frequency is output to the voltage controlled oscillator; when one of the first and the second phase difference signals is at H-level, while the other is at L-level or when the both have high impedance, the control signal for maintaining the oscillation frequency is outputted to the voltage controlled oscillator.

11. The phase-locked loop according to claim 5, wherein the loop filter is composed of a complete integral loop filter incorporating an operational amplifier, the complete integral loop filter being designed for receiving the first and the second phase difference signals as input signals to its one input side and the divided voltage of the H-level reference voltage and L-level reference voltage as input signals to its the other input side for outputting the control voltage to the voltage controlled oscillator from its output side; when both the first and the second phase difference signals are at H-level or L-level, the control signal for decreasing or increasing the oscillation frequency is outputted to the voltage controlled oscillator; when one of the first and the second phase difference signals is at H-level while the other is at L-level, or when the both have high impedance, the control signal for maintaining the oscillation frequency is output to the voltage controlled oscillator.

12. The phase-locked loop according to claim 6, wherein the loop filter is composed of a complete integral loop filter incorporating an operational filter, the complete integral loop filter being designed for receiving the first and the second phase difference signals as inputs to its one input side and the divided voltages of the H-level reference signal and the L-level reference signal as inputs to its the other input side for outputting the control voltage to the voltage controlled oscillator from its output side; when both the first and the second phase difference signals are at H-level or L-level, the control signal for decreasing or increasing the oscillation frequency is outputted to the voltage controlled oscillator; when one of the first phase difference signal and the second phase difference signal is at H-level while the other is at L-level, or when the both have high impedance, the control signal for maintaining the oscillation frequency is outputted to the voltage controlled oscillator.

13. A phase-locked loop circuit comprising a phase comparator for comparing the reference signal an the comparison signal to output a signal corresponding to the phase difference, a loop filter for outputting the control voltage corresponding to the signal outputted from the phase comparator, a voltage controlled oscillator for outputting the clock having a frequency corresponding to the control voltage outputted from the loop filter and a loop counter for dividing the frequency of the clock outputted from the voltage controlled oscillator into 1/N, N: an integer to feed it back as a comparison signal to the phase comparator, wherein there are further provided a gate control signal generation circuit for generating a gate control signal by advancing the phase of the comparison signal by 1 clock and a 3-state buffer for not only outputting the signals of 3 different states corresponding to the phase difference between the reference signal and the comparison signal but also being controlled in active state by the gate control signal.

14. The phase-locked loop according to claim 13, wherein the phase comparator comprises a first D-flip-flop for receiving the reference clock as an input to its clock terminal and the L-level voltage as an input to its data terminal, a second D-flip-flop for receiving the comparison signal as an input to its clock terminal and, the H-level voltage as an input to its data terminal, a third D-flip-flip for receiving the gate control signal as an input to its clock terminal and H-level voltage as an input to its data terminal, a first 3-state buffer for receiving the Q output of the first D-flip-flop as an input to output the first phase difference signal (3-state signal), a second 3-state buffer for receiving the Q output of the first D-flip-flop as an input to output a second phase difference signal, 3-state signal, and a control circuit for not only controlling the first and the second 3-state buffers in active state according to the OR signal based on the inverted signal of the Q output of the first D-flip-flop and the Q output of the third D-flip-flop but also for controlling the first and the second 3-state buffers in inactive state according to the inverted signal of the AND signal based on the inverted signal of the Q output of the first D-flip-flop and the Q output of the second D-flip-flop.

15. The phase-locked loop according to claim 14, wherein the control circuit comprises an inverter for inverting the Q output of the first D-flip-flip, an OR gate for outputting the OR signal based on the output signal of the inverter and the Q output of the third D-flip-flop, a fourth D-flip-flop for receiving the output signal of the OR gate as an input to its clock terminal, H-level voltage as an input to its data terminal ad Q output as a gate control signal to the first and the second 3-state buffers, an NAND gate for inverting, for output, the AND signal based on the output signal of the inverter and the Q output of the second D-flip-flop and a first delayer for delaying the output signal from the NAND gate by a set time period t1 for output to the reset terminal of the fourth D-flip-flop.

16. The phase-locked loop according to the claim 15, wherein the control circuit comprises a second delayer for delaying the output signal of the first delayer by a set time period t2 for output to the set terminal of the first D-flip-flop and the reset terminals of the second and the third D-flip-flop's.

17. The phase-locked loop according to claim 14, wherein the loop filter is composed of a complete integral loop filter incorporating an operational amplifier; the operational amplifier receives the first phase difference signal and the second phase difference signal as inputs to its one input side and the divided voltages of the H-level reference voltage and the L-level reference voltage as inputs to its the other input side and outputs the control voltage to the voltage controlled oscillator from its output side; when both the first and the second phase difference signals are at H-level or L-level, the control voltage for decreasing or increasing the oscillation frequency is outputted to the voltage controlled oscillator; when one of the first and the second phase difference signals is at H-level while the other is at L-level, or when the both have high impedance, the control voltage for maintaining the oscillation frequency is outputted to the voltage controlled oscillator.

18. The phase-locked loop according to claim 13, wherein the loop counter comprises a counter for counting the clock outputted from the controlled voltage oscillator, a first coincidence circuit for not only outputting the comparison signal, obtained by dividing the frequency of the clock into 1/N, when the counted value of the counter coincides with the set value N but also for outputting the comparison signal to the reset terminal of the counter and a second coincidence circuit for outputting the gate control signal, obtained by dividing the frequency of the clock into 1/N when the counted value of the counter coincides with a set value (N–1), the loop counter incorporating a gate control signal generation circuit.

19. The phase-locked loop according to the claim 17, wherein the loop counter comprises a counter for counting the clock outputted from the voltage controlled oscillator, a first coincidence circuit for not only outputting the comparison signal, obtained by dividing the frequency of the clock into 1/N, when the counted value of the counter coincides with a set value N but also for outputting the comparison signal to the reset terminal of the counter and a second coincidence circuit for outputting the gate control signal, obtained by dividing the frequency of the clock into 1/N, the loop counter incorporating a gate control signal generation circuit.

* * * * *